(12) United States Patent
Okamoto et al.

(10) Patent No.: US 8,410,502 B2
(45) Date of Patent: Apr. 2, 2013

(54) LIGHT-EMITTING DEVICE, PLANAR LIGHT SOURCE INCLUDING THE LIGHT-EMITTING DEVICE, AND LIQUID CRYSTAL DISPLAY DEVICE INCLUDING THE PLANAR LIGHT SOURCE

(75) Inventors: Kazuhiro Okamoto, Osaka (JP); Masahiro Konishi, Osaka (JP); Masaharu Kitano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 164 days.

(21) Appl. No.: 12/868,171

(22) Filed: Aug. 25, 2010

(65) Prior Publication Data
US 2011/0051039 A1  Mar. 3, 2011

(30) Foreign Application Priority Data
Sep. 1, 2009  (JP) ................... 2009-201908

(51) Int. Cl.
H01L 33/48 (2010.01)
(52) U.S. Cl. ............... 257/98; 257/99; 257/100
(58) Field of Classification Search ............. 257/98–100
See application file for complete search history.

(56) References Cited

U.S. PATENT DOCUMENTS

| | | | |
|---|---|---|---|
| 5,771,254 A * | 6/1998 | Baldwin et al. ............... | 372/31 |
| 6,876,685 B2 * | 4/2005 | Umemoto et al. .......... | 372/43.01 |
| 7,822,090 B2 * | 10/2010 | Minamio et al. ........... | 372/49.01 |
| 7,919,789 B2 * | 4/2011 | Chang et al. ............... | 257/99 |
| 7,943,953 B2 * | 5/2011 | Sakamoto et al. ........... | 257/100 |
| 8,106,414 B2 * | 1/2012 | Sugiyama .................. | 257/98 |
| 2002/0001192 A1 | 1/2002 | Suehiro et al. | |
| 2003/0189830 A1 | 10/2003 | Sugimoto et al. | |
| 2007/0029571 A1 * | 2/2007 | Hanaoka et al. ........... | 257/99 |
| 2009/0230420 A1 | 9/2009 | Bogner et al. | |

FOREIGN PATENT DOCUMENTS

| | | |
|---|---|---|
| JP | 2001-345485 | 12/2001 |
| JP | 2002-94122 | 3/2002 |
| JP | 2004-179438 | 6/2004 |
| JP | 2004-335518 | 11/2004 |
| JP | 2005-159311 | 6/2005 |
| JP | 2006-013157 | 1/2006 |
| JP | 2006-222358 | 8/2006 |
| JP | 3972889 | 6/2007 |
| JP | 2008-546192 | 12/2008 |
| JP | 2009-044112 | 2/2009 |

* cited by examiner

Primary Examiner — Eugene Lee
(74) Attorney, Agent, or Firm — Nixon & Vanderhye P.C.

(57) ABSTRACT

A light-emitting device according to an embodiment of the present invention includes a light-emitting element, and a package substrate on which this light-emitting element is placed. This package substrate includes a placement face on which the light-emitting element is placed, a back face that is opposed to the placement face, and a mounting face that is opposed, between the placement face and the back face, to a mounting substrate when the light-emitting device is mounted, and includes a first recess portion that extends, on the mounting face, from the back face toward the placement face and that has a first heat conduction member formed on the surface thereof, and an intermediate heat conduction member for conducting heat between the light-emitting element and the first heat conduction member.

20 Claims, 11 Drawing Sheets

LIGHT-EMITTING DEVICE, PLANAR LIGHT SOURCE INCLUDING THE LIGHT-EMITTING DEVICE, AND LIQUID CRYSTAL DISPLAY DEVICE INCLUDING THE PLANAR LIGHT SOURCE

CROSS-REFERENCE TO RELATED APPLICATION

This application claims priority under 35 U.S.C. §119(a) on Patent Application No. 2009-201908 filed in Japan on Sep. 1, 2009, the entire contents of which are herein incorporated by reference.

BACKGROUND AND SUMMARY

The technology presented herein relates to a light-emitting device, a planar light source, and a liquid crystal display device.

LEDs (light-emitting diodes) have been widely used along with the improvement in their efficiency in recent years as a more energy-saving light source than electric bulbs and fluorescent lamps. In recent years, development of blue LEDs has been making progress, and white LEDs achieved by using a combination of a blue LED and a fluorescent material are also in practical use. White LEDs are being used as a light source for the small liquid crystal backlight devices of mobile terminals and the like. In particular, a liquid crystal backlight device using a side light-emitting type light-emitting device is being developed to achieve slimming down of mobile terminals and the like. A side light-emitting type light-emitting device applied to a liquid crystal backlight device is configured to be opposed to the end face of a light guide plate that is disposed on the back face of a liquid crystal panel, and introduce light into the light guide plate from the end face. In this case, a planar light source for a liquid crystal backlight device is constituted by a side light-emitting type light-emitting device, a light guide plate, and a mounting substrate on which the light-emitting device is mounted.

Since the side light-emitting type light-emitting device described above has an advantage that a liquid crystal backlight device can be slimmed down, such a side light-emitting type light-emitting device has also been gradually utilized in, for instance, a medium-sized liquid crystal backlight device of a notebook computer and the like, and a large-sized liquid crystal backlight device of a liquid crystal television and the like, recently. However, a higher-intensity light source becomes necessary with an increase in the size of a liquid crystal backlight device. Furthermore, it is also necessary to satisfy the demand for cost reduction compared to current light sources such as fluorescent tubes.

Here, although it is possible to consider using many LEDs as a technique for increasing the intensity of a light source, it will be difficult to satisfy the demand for cost reduction with this technique. Accordingly, it is necessary to increase the intensity by improving the performance of individual LEDs. It is possible to consider increasing the driving current for LEDs as a technique for increasing the intensity of individual LEDs. However, with this technique, improvement of heat dissipation properties and heat resistance properties of a light-emitting device (LED package) will be important due to an increase in the amount of heat generated by an LED.

Japanese Patent No. 3972889 (hereinafter, referred to as Patent Document 1) discloses a light-emitting device that improves light extraction efficiency by reflecting light from an LED chip by an inner wall face of a package. Further, Patent Document 1 discloses that in order to reflect light from the LED chip efficiently, white pigments such as titanium oxide are mixed in a resin that is used as the molding material of the package, and the package is formed using an insert molding method. JP 2005-159311A (hereinafter, referred to as Patent Document 2) discloses a light-emitting device whose package is a ceramic package.

However, a resin package as disclosed in Patent Document 1 has a problem that such a resin package cannot handle an increase in the size of a liquid crystal backlight device since its heat dissipation properties and heat resistance properties are insufficient. Further, a ceramic package as disclosed in Patent Document 2 has a problem that although such a ceramic package has higher heat conductivity compared to the resin package, it cannot be said that its heat dissipation properties are sufficient.

The present technology has been conceived in light of the above problems, and a feature thereof is to provide a light-emitting device that can improve heat dissipation properties, a planar light source including this light-emitting device, and a liquid crystal display device including this planar light source.

According to the present technology, means for solving the above problems are configured as follows.

A light-emitting device according to the example embodiments presented herein includes a light-emitting element, and a package substrate on which the light-emitting element is placed. The package substrate includes a placement face on which the light-emitting element is placed, a back face that is opposed to the placement face, and a mounting face that is opposed, between the placement face and the back face, to a mounting substrate when the light-emitting device is mounted, and includes a first recess portion that extends, on the mounting face, from the back face toward the placement face and that has a first heat conduction member formed on a surface thereof, and an intermediate heat conduction member for conducting heat between the light-emitting element and the first heat conduction member.

According to the above configuration, as a heat dissipation path for releasing heat generated by the light-emitting element toward the mounting substrate, a heat dissipation path including the first heat conduction member that is opposed to the mounting substrate, and the intermediate heat conduction member for conducting heat between the light-emitting element and the first heat conduction member is formed. Thereby, heat generated by the light-emitting element can be efficiently released toward the mounting substrate, and thus heat dissipation properties of the light-emitting device can be improved. Further, since the space that can be filled with a fixing wax material with which the package substrate is fixed to the mounting substrate can be secured, the parallelism of the mounting face relative to the mounting substrate can be secured. Further, when the light-emitting device (the mounting face) is mounted on the mounting substrate, light can be emitted in the side face direction.

Further, in the light-emitting device according to the present embodiments, the intermediate heat conduction member includes a second heat conduction member that is connected to the first heat conduction member and extends toward the light-emitting element inside the package substrate.

According to the above configuration, as a heat dissipation path for releasing heat generated by the light-emitting element toward the mounting substrate, a heat dissipation path including the second heat conduction member that is connected to the first heat conduction member and extends toward the light-emitting element inside the package substrate, and the first heat conduction member that is connected to the second heat conduction member is formed. Thereby, heat generated by the light-emitting element can be efficiently released toward the mounting substrate, and thus heat dissipation properties of the light-emitting device can be improved.

Further, the light-emitting device according to the present embodiments includes a placement heat conduction member on which the light-emitting element is placed, and the placement heat conduction member is connected to the second heat conduction member.

According to the above configuration, as a heat dissipation path for releasing heat generated by the light-emitting element toward the mounting substrate, a heat dissipation path including the placement heat conduction member on which the light-emitting element is placed, and the second heat conduction member that is connected to the placement heat conduction member is formed. Thereby, heat generated by the light-emitting element can be further more efficiently released toward the mounting substrate, and thus heat dissipation properties of the light-emitting device can be improved.

Further, in the light-emitting device according to the present embodiments, the placement heat conduction member and the second heat conduction member are formed integrally.

According to the above configuration, since the placement heat conduction member and the second heat conduction member can be formed integrally, heat conductivity can be improved, and the manufacturing process can be simplified.

Further, in the light-emitting device according to the present embodiments, the intermediate heat conduction member includes a third heat conduction member that is disposed from the placement face up to the back face inside the package substrate, and a fourth heat conduction member that connects the third heat conduction member and the first heat conduction member on the back face.

According to the above configuration, as a heat dissipation path for releasing heat generated by the light-emitting element toward the mounting substrate, a heat dissipation path including the third heat conduction member that is disposed from the placement face up to the back face inside the package substrate, the fourth heat conduction member that is disposed so as to connect the third heat conduction member and the first heat conduction member on the back face, and the first heat conduction member that is connected to the fourth heat conduction member is formed. Thereby, heat generated by the light-emitting element can be efficiently released toward the mounting substrate, and thus heat dissipation properties of the light-emitting device can be improved.

Further, the light-emitting device according to the present embodiments includes a placement heat conduction member on which the light-emitting element is placed, and the placement heat conduction member is connected to the third heat conduction member.

According to the above configuration, as a heat dissipation path for releasing heat generated by the light-emitting element toward the mounting substrate, a heat dissipation path including the placement heat conduction member on which the light-emitting element is placed, and the third heat conduction member that is connected to the placement heat conduction member is formed. Thereby, heat generated by the light-emitting element can be further more efficiently released toward the mounting substrate, and thus heat dissipation properties of the light-emitting device can be improved.

Further, in the light-emitting device according to the present embodiments, the placement heat conduction member and the third heat conduction member are formed integrally.

According to the above configuration, since the placement heat conduction member and the third heat conduction member can be formed integrally, heat conductivity can be improved, and the manufacturing process can be simplified.

Further, in the light-emitting device according to the present embodiments, the package substrate is a ceramic substrate.

According to the above configuration, since the package substrate is constituted by a ceramic substrate, heat resistance properties can be improved, and reliability can be improved.

Further, in the light-emitting device according to the present embodiments, the first recess portion is formed from the back face side of the mounting face to a position corresponding to the placement face.

According to the above configuration, a flat face can be secured on the mounting face, and thus the accuracy of mounting on the mounting substrate can be secured.

Further, in the light-emitting device according to the present embodiments, a wall face of the first recess portion is formed so as to have an arc-shaped cross section.

According to the above configuration, the first recess portion can be easily formed.

Further, the light-emitting device according to the present embodiments includes an internal anode terminal and an internal cathode terminal that are connected to the light-emitting element. The internal anode terminal is connected to an external anode terminal that is provided on the mounting face, and the internal cathode terminal is connected to an external cathode terminal that is provided on the mounting face.

According to the above configuration, the internal anode terminal and the internal cathode terminal can be connected to wiring of the mounting substrate via the external anode terminal and the external cathode terminal.

Further, in the light-emitting device according to the present embodiments, the internal anode terminal and the internal cathode terminal each extend in a direction parallel to the placement face on which the light-emitting element is placed.

According to the above configuration, the package substrate can be easily formed.

Further, in the light-emitting device according to the present embodiments, the external anode terminal and the external cathode terminal are each provided from an end on the back face side of the mounting face to a position corresponding to the placement face.

According to the above configuration, the accuracy with which the external anode terminal and the external cathode terminal are connected to the wiring of the mounting substrate can be improved, and the reliability of connection can be secured.

Further, in the light-emitting device according to the present embodiments, the external anode terminal and the external cathode terminal are respectively provided on second recess portions that are formed in corner portions of the package substrate.

According to the above configuration, the external anode terminal and the external cathode terminal can be easily connected to and aligned with the wiring of the mounting substrate.

Further, in the light-emitting device according to the present embodiments, a wall face of each of the second recess portions is formed so as to have an arc-shaped cross section.

According to the above configuration, the second recess portion can be easily formed.

Further, in the light-emitting device according to the present embodiments, a difference in level is provided between the placement face on which the light-emitting element is placed and an internal terminal plane that is constituted by the internal anode terminal and the internal cathode terminal.

According to the above configuration, it is possible to easily prevent the internal anode terminal and the internal cathode terminal from short-circuiting.

Further, in the light-emitting device according to the present embodiments, the internal terminal plane is disposed closer to the back face than the placement face on which the light-emitting element is placed is.

According to the above configuration, the package substrate can be easily formed.

A planar light source according to the present embodiments includes the light-emitting device according to the present invention, a mounting substrate on which the light-emitting device is mounted, and a light guide plate for guiding light from the light-emitting device. The first recess portion is filled with a wax material for fixing the package substrate to the mounting substrate.

According to the above configuration, as a heat dissipation path for releasing heat toward the mounting substrate, a heat dissipation path for releasing heat toward the mounting substrate via the wax material is constituted, and thus heat dissipation properties can be improved. Further, since the first recess portion is filled with the wax material, positioning of the mounting face relative to the mounting substrate is performed with high accuracy, and thus the uniformity of light that exits from the light guide plate can be improved.

A planar light source according to the present embodiments includes the light-emitting device according to the present invention, a mounting substrate on which the light-emitting device is mounted, and a light guide plate for guiding light from the light-emitting device. Each of the second recess portions is filled with a wax material for fixing the package substrate to the mounting substrate.

According to the above configuration, as a heat dissipation path for releasing heat toward the mounting substrate, a heat dissipation path for releasing heat toward the mounting substrate via the wax material is constituted, and thus heat dissipation properties can be improved. Further, since each of the second recess portions is filled with the wax material, positioning of the mounting face relative to the mounting substrate is performed with high accuracy, and thus the uniformity of light that exits from the light guide plate can be improved.

A liquid crystal display device according to the present embodiments includes the planar light source according to the present embodiments, and a liquid crystal panel, and the planar light source is used as a backlight of the liquid crystal panel.

According to the above configuration, since the planar light source having good heat dissipation properties and excellent light uniformity is used as a backlight, the liquid crystal display device that can perform uniform display with high accuracy can be achieved.

DESCRIPTION OF PREFERRED EMBODIMENTS

Embodiments are described with reference to the accompanying drawings.

Embodiment 1

Figure 2:
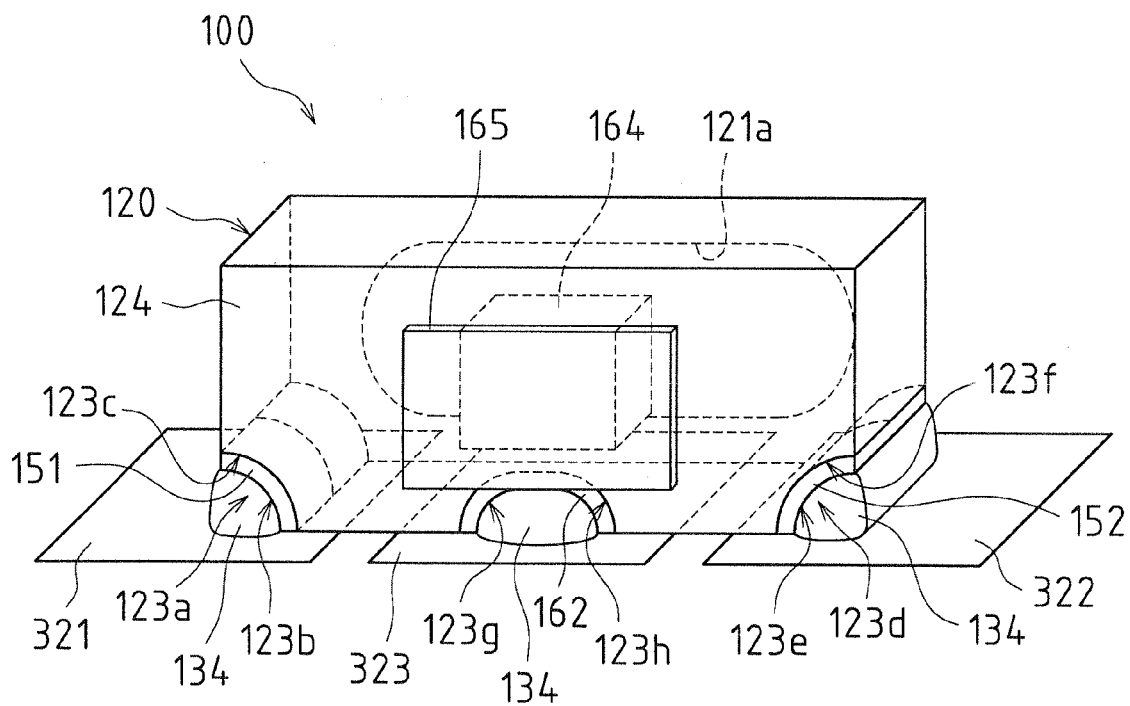
FIG. 2 is a perspective view conceptually showing the light-emitting device according to Embodiment 1 that is seen obliquely from above and a back face side.
Figure 3:
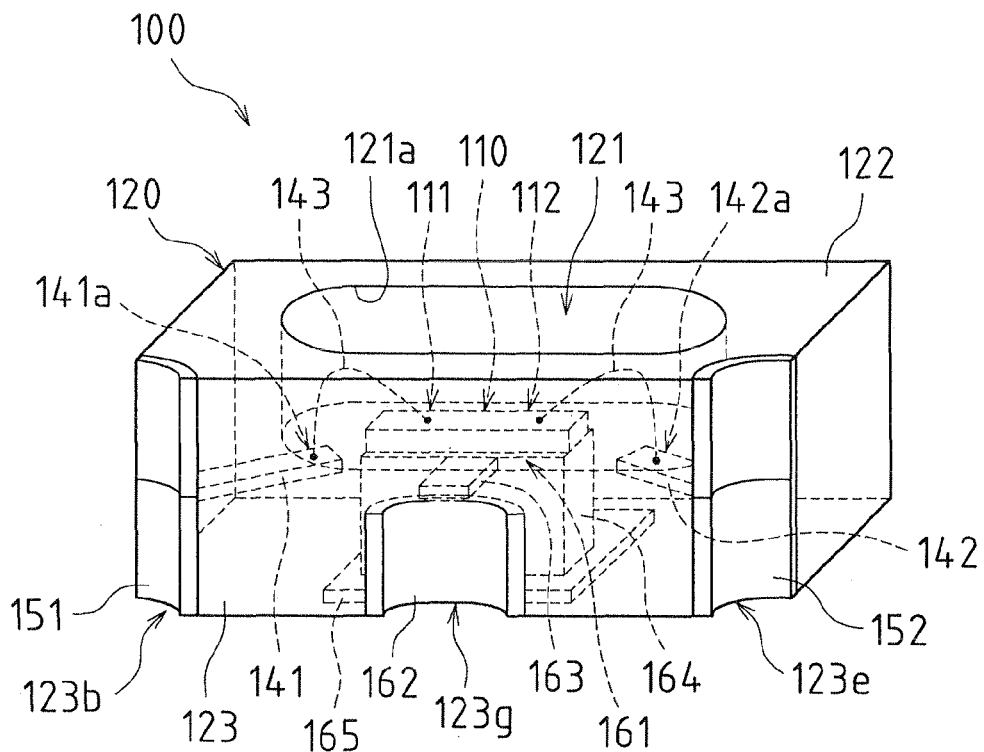
FIG. 3 is a perspective view conceptually showing the light-emitting device according to Embodiment 1 that is seen obliquely from below and an opening face side.

A light-emitting device according to Embodiment 1 is described with reference to FIGS. 1 to 3.

Figure 1:
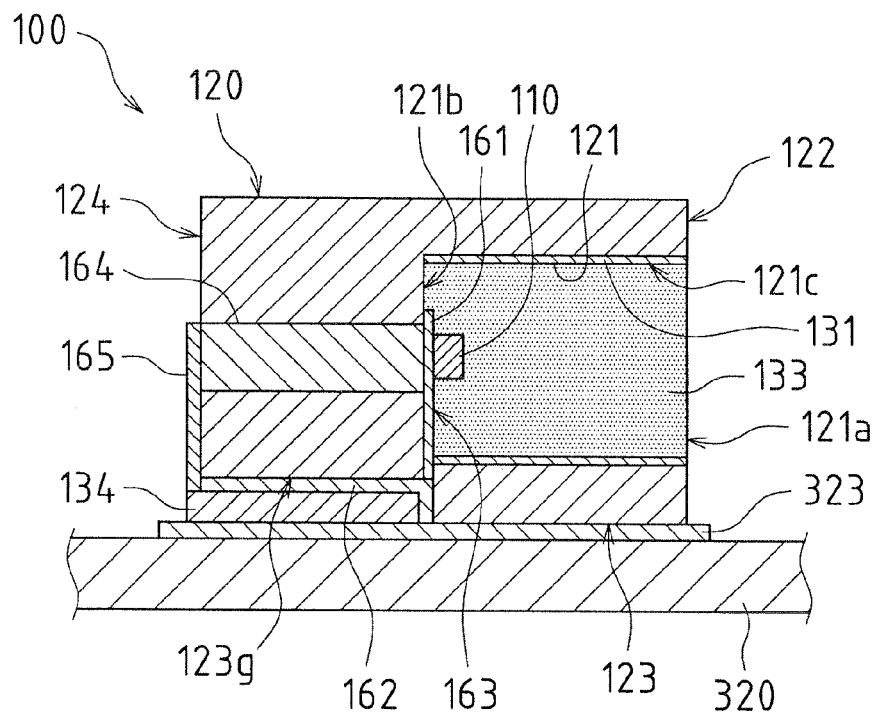
FIG. 1 is a cross-sectional view schematically showing a light-emitting device according to Embodiment 1.

FIG. 1 is a cross-sectional view showing the light-emitting device according to Embodiment 1. FIG. 2 is a perspective view conceptually showing the light-emitting device according to Embodiment 1 that is seen obliquely from above. FIG. 3 is a perspective view conceptually showing the light-emitting device according to Embodiment 1 that is seen obliquely from below. Note that FIGS. 1 and 2 show, for convenience, a part of a mounting substrate on which the light-emitting device is mounted.

A light-emitting device 100 according to Embodiment 1 is provided with an LED chip 110 and a ceramic substrate 120. The light-emitting device 100 is mounted on land patterns 321, 322, and 323 formed on a mounting substrate 320. The light-emitting device 100 is constituted as a side light-emitting type light-emitting device, and emits light from an opening 121a formed in an opening face 122, which is a side face, when mounted such that a mounting face 123 is opposed to the mounting substrate 320.

As the LED chip 110, a gallium nitride semiconductor light-emitting element that can emit blue light is used, for example. The gallium nitride semiconductor light-emitting element emits primary light, which is blue light that has a light emission peak in a blue wavelength region where a wavelength is 400 nm to 500 nm inclusive. Note that the above material of the LED chip 110 is an example, and the present invention is not particularly limited as long as the LED chip emits primary light having a wavelength that enables excitation of the fluorescent material described later.

A P side electrode 111 and an N side electrode 112, which are a pair of pad electrodes, are formed on the surface of the LED chip 110. The P side electrode 111 is wire-bonded to an internal anode terminal 141 via a wire 143. The N side electrode 112 is wire-bonded to an internal cathode terminal 142 via a wire 143.

The ceramic substrate 120 is a package substrate formed in a substantially rectangular solid shape. The ceramic substrate 120 has a chip recess portion 121 in which the LED chip 110 is disposed. Further, the ceramic substrate 120 is provided with the opening face 122 that has the opening 121a of the chip recess portion 121, the mounting face 123 that is adjacent to the opening face 122 and is opposed to the mounting substrate 320, and a back face 124 that is provided on the side opposite to the opening face 122. Both the opening face 122 and the back face 124 are perpendicularly formed relative to the mounting face 123. Note that the package substrate includes a wiring portion that is internally disposed (for example, the internal anode terminal 141 and the internal cathode terminal 142 described below, and the like), and heat conduction members (for example, a placement heat conduction member 161, a first heat conduction member 162 to a fourth heat conduction member 165, described below, and the like).

The opening 121a of the chip recess portion 121 is formed in an oval, for example. The LED chip 110 is disposed on a placement face 121b that is disposed at the bottom portion of the chip recess portion 121. The placement face 121b is formed in a direction that intersects the mounting face 123. The placement heat conduction member 161 is provided on the placement face 121b, and the LED chip 110 is placed on the placement heat conduction member 161. An inner end portion 141a of the internal anode terminal 141 and an inner end portion 142a of the internal cathode terminal 142 are placed on the placement face 121b. The internal anode terminal 141, the internal cathode terminal 142, and the placement heat conduction member 161 are disposed so as to be separated from each other.

An inner wall face 121c of the chip recess portion 121 extends in a direction that intersects the placement face 121b. A reflecting layer 131 that, for example, is made of Ag plating or the like is formed on the inner wall face 121c. The reflecting layer 131 is separated from the internal anode terminal 141 and the internal cathode terminal 142. A glass coat serving as a protective layer is formed on the surface of the reflecting layer 131. Note that the chip recess portion 121 may have a shape that tapers out toward the opening face 122.

The chip recess portion 121 is filled with a fluorescent material-containing resin 133. Therefore, the LED chip 110 is covered with the fluorescent material-containing resin 133. For example, a resin obtained by dispersing a fluorescent material in a silicone resin is used as the fluorescent material-containing resin 133.

The fluorescent material absorbs blue light (primary light) that the LED chip 110 emits, and releases fluorescence (secondary light). The light-emitting device 100 is constituted so as to emit white light by mixing primary light and secondary light in this way. In other words, the fluorescent material is a substance (yellow fluorescent material) that absorbs primary light, and emits secondary light that has a light emission peak in, for example, a yellow wavelength region where a wavelength is 550 nm to 600 nm inclusive. Accordingly, the light-emitting device 100 can emit white light by mixing primary light and secondary light. Further, instead of a yellow fluorescent material, a fluorescent material obtained by mixing a green fluorescent material and a red fluorescent material may be used, and if the light-emitting device 100 in which such a fluorescent material is applied is used as a backlight for liquid crystal display, the reproduction region of the liquid crystal display colors can be widened, compared to the case of using a yellow fluorescent material.

Note that as a fluorescent material, for example, BOSE (Ba, O, Sr, Si, Eu) or the like can be suitably used. Further, other than BOSE, SOSE (Sr, Ba, Si, O, Eu), YAG (Cè activation yttrium aluminum garnet), a sialon ((Ca), Si, Al, O, N, Eu), β sialon (Si, Al, O, N, Eu), or the like can be suitably used.

The internal anode terminal 141 is a thin metal layer, and is formed as a wiring pattern. The internal anode terminal 141 extends in the direction parallel to the placement face 121b. The internal anode terminal 141 is connected to an external anode terminal 151 provided on the mounting face 123 of the ceramic substrate 120. The external anode terminal 151 is provided on a second recess portion 123b formed in a corner portion 123a of the mounting face 123.

Specifically, the internal anode terminal 141 passes through the inside of the ceramic substrate 120 from the placement face 121b, and extends toward the corner portion 123a. The second recess portion 123b is formed in the corner portion 123a, and the second recess portion 123b extends from the end on the opening face 122 side to the end on the back face 124 side. A wall face 123c of the second recess portion 123b is formed so as to have an arc-shaped cross section. Note that the cross sectional shape of the wall face 123c of the second recess portion 123b may be other than the arc shape.

The external anode terminal 151 is formed on the wall face 123c of the second recess portion 123b. The external anode terminal 151 is formed from the end on the back face 124 side of the second recess portion 123b toward the opening face 122, but is not formed up to the end on the opening face 122 side. In other words, the external anode terminal 151 is formed up to a position where it is connected to the internal anode terminal 141. The external anode terminal 151 is connected to the electrode land pattern 321 (see FIG. 2) formed on the mounting substrate 320. Further, in the mounted state, the second recess portion 123b is filled with a wax material 134 for fixing the ceramic substrate 120 to the mounting substrate 320. Since the second recess portion 123b extends from the end on the opening face 122 side to the end on the back face 124 side, it is possible to easily check the wetting and melting conditions of the wax material 134 when mounting the light-emitting device 100 on the mounting substrate 320. Note that a configuration may be adopted in which a back face anode terminal connected to the external anode terminal 151 is provided on the back face 124 of the ceramic substrate 120. In this way, it is possible to easily check characteristics of the light-emitting device 100 by bringing an inspection terminal into contact with the back face anode terminal in an inspection process.

The internal cathode terminal 142 is a thin metal layer, and is formed as a wiring pattern. The internal cathode terminal 142 extends in the direction parallel to the placement face 121b. The internal cathode terminal 142 is connected to an external cathode terminal 152 provided on the mounting face 123 of the ceramic substrate 120. The external cathode terminal 152 is provided on a second recess portion 123e formed in a corner portion 123d of the mounting face 123.

Specifically, the internal cathode terminal 142 passes through the inside of the ceramic substrate 120 from the placement face 121b, and extends toward the corner portion 123d. The second recess portion 123e is formed in the corner portion 123d, and the second recess portion 123e extends from the end on the opening face 122 side to the end on the back face 124 side. A wall face 123f of the second recess portion 123e is formed so as to have an arc-shaped cross section. Note that the cross sectional shape of the wall face 123f of the second recess portion 123e may be other than the arc shape.

The external cathode terminal 152 is formed on the wall face 123f of the second recess portion 123e. The external cathode terminal 152 is formed from the end on the back face 124 side of the second recess portion 123e toward the opening face 122, but is not formed up to the end on the opening face 122 side. The external cathode terminal 152 is formed up to a position where it is connected to the internal cathode terminal 142. The reason for this will be described later. The external cathode terminal 152 is connected to the electrode land pattern 322 (see FIG. 2) formed on the mounting substrate 320. Further, in the mounted state, the second recess portion 123e is filled with the wax material 134 for fixing the ceramic substrate 120 to the mounting substrate 320. Since the second recess portion 123e extends from the end on the opening face 122 side to the end on the back face 124 side, it is possible to easily check the wetting and melting conditions of the wax material 134 when mounting the light-emitting device 100 on the mounting substrate 320. Note that a configuration may be adopted in which a back face cathode terminal connected to the external cathode terminal 152 is provided on the back face 124 of the ceramic substrate 120. In this way, it is possible to easily check characteristics of the light-emitting device 100 by bringing an inspection terminal into contact with the back face cathode terminal in an inspection process.

Embodiment 1 has a feature that the ceramic substrate 120 is provided with heat dissipation paths for dissipating heat generated by the LED chip 110 by heat conduction to the mounting substrate 320. The following is a detailed description of the heat dissipation paths of Embodiment 1.

The ceramic substrate 120 is provided with the placement heat conduction member 161, the first heat conduction member 162, the second heat conduction member 163, the third heat conduction member 164, and the fourth heat conduction member 165. These heat conduction members (the placement heat conduction member 161, and the first heat conduction member 162 to the fourth heat conduction member 165) are formed using a metal with higher heat conductivity than that of the ceramic substrate 120.

The placement heat conduction member 161 is a thin metal layer, and is formed similarly to a wiring pattern, for example. The placement heat conduction member 161 is a member that constitutes an attachment face to which the LED chip 110 is attached. Specifically, the placement heat conduction member 161 is disposed on the placement face 121b, and the LED chip 110 is die-bonded to the placement heat conduction member 161. Note that the placement face 121b and the attachment face to which the LED chip 110 is attached can be collectively considered as a placement face.

The first heat conduction member 162 is constituted as a metal film that is made of, for example, Au plating or the like. The first heat conduction member 162 is provided on a first recess portion 123g formed along the mounting face 123. Specifically, the first recess portion 123g extends from the end on the back face 124 side toward the opening face 122, but does not reach the end on the opening face 122 side. In other words, the first recess portion 123g extends up to a position where the second heat conduction member 163 is connected to the first heat conduction member 162. Accordingly, a part of the mounting face 123 from the end of the first recess portion 123g to the end on the opening face 122 side can be made as a flat face, and thus the accuracy of mounting on the mounting substrate 320 can be secured.

Further, when manufacturing the light-emitting device 100, it is preferable, in terms of mass production, to manufacture a large number of the light-emitting devices 100 simultaneously with the application of a single ceramic base material, and separate the individual light-emitting devices 100 by sectioning the mounting face 123 (see Embodiment 2, for example). However, the first heat conduction member 162 formed on the first recess portion 123g has the advantage of not being affected by the sectioning.

A wall face 123h of the first recess portion 123g is formed so as to have an arc-shaped cross section. The first heat conduction member 162 is formed on the wall face 123h of the first recess portion 123g. The first heat conduction member 162 is connected to the heat dissipation land pattern 323 formed on the mounting substrate 320. The first recess portion 123g is filled with the wax material 134 for fixing the ceramic substrate 120 to the mounting substrate 320. Note that the cross sectional shape of the wall face 123h of the first recess portion 123g may be other than the arc shape.

Further, the first recess portion 123g extends from the end on the back face 124 side toward the opening face 122, but does not reach the end on the opening face 122 side. Accordingly, since it is possible to prevent the wax material 134 getting into the opening face 122, the problem of the wax material 134 coming into contact with and deteriorating the surface of the fluorescent material-containing resin 133 with which the chip recess portion 121 is filled can be prevented.

The second heat conduction member 163 is a thin metal layer, and is formed similarly to a wiring pattern, for example. The second heat conduction member 163 is a member that connects the placement heat conduction member 161 and the first heat conduction member 162. In Embodiment 1, the second heat conduction member 163 is integrally formed with the placement heat conduction member 161. In other words, the placement heat conduction member 161 is configured to extend toward the first heat conduction member 162. Thus, if the second heat conduction member 163 is integrally formed with the placement heat conduction member 161, the ceramic substrate 120 can be easily formed.

The fourth heat conduction member 165 is constituted as a metal film that is made of, for example, Au plating or the like. The fourth heat conduction member 165 is provided on the back face 124. The fourth heat conduction member 165 is formed so as to extend from the substantially center portion of the back face 124 toward the mounting face 123, and is connected to the first heat conduction member 162 on the periphery of the first recess portion 123g.

The third heat conduction member 164 is formed using a metal having high heat conductivity such as Cu, for example. The third heat conduction member 164 is a member that connects the placement heat conduction member 161 and the fourth heat conduction member 165. The third heat conduction member 164 is formed so as to pass through the inside of the ceramic substrate 120. Note that the third heat conduction member 164 may be integrally formed with the placement heat conduction member 161. In other words, the placement heat conduction member 161 may be configured to extend toward the fourth heat conduction member 165. It is possible to achieve reduction of the number of components by integrally forming the third heat conduction member 164 with the placement heat conduction member 161 in this way.

Here, the following is a reason for adopting a configuration in which the third heat conduction member 164 is not exposed on the mounting face 123 of the ceramic substrate 120. If the third heat conduction member 164 were exposed on the mounting face 123 of the ceramic substrate 120, when mounting the light-emitting device 100 on the mounting substrate 320, heat would escape due to heat directly transferring toward the third heat conduction member 164, and thus the wax material 134 would not easily melt. Accordingly, by adopting a configuration in which a ceramic member is interposed between the mounting face 123 and the third heat conduction member 164, heat escape is suppressed, which allows the wax material 134 to quickly melt.

Note that a configuration may be adopted in which the side face of the third heat conduction member 164 is exposed on the mounting face 123 of the ceramic substrate 120, and in this case, it is possible to further improve heat dissipation properties described later.

Further, because of the similar reason, the external anode terminal 151, the external cathode terminal 152, and the first heat conduction member 162 are not formed over the whole region of the mounting face 123 between the end on the opening face 122 side and the end on the back face 124 side, but rather formed partially, which is as described above. However, the external anode terminal 151, the external cathode terminal 152, and the first heat conduction member 162 can be formed over the whole region of the mounting face 123 between the end on the opening face 122 side and the end on the back face 124 side.

Next is a description of the heat dissipation action of the placement heat conduction member 161, and the first heat conduction member 162 to the fourth heat conduction member 165 of the light-emitting device 100 according to Embodiment 1. Note that the placement heat conduction member 161 is not absolutely necessary, and it is also possible to directly place the LED chip 110 on the third heat conduction member 164, for example.

In the ceramic substrate 120, heat dissipation paths including the placement heat conduction member 161, and the first heat conduction member 162 to the fourth heat conduction member 165 are formed, as heat dissipation paths for releasing heat generated by the LED chip 110 to the mounting substrate 320. This enables heat generated by the LED chip 110 to be efficiently released toward the mounting substrate 320, and thus it is possible to improve heat dissipation properties of the light-emitting device 100.

To be specific, as heat dissipation paths for releasing heat generated by the LED chip 110 toward the mounting substrate 320, the following paths are formed, namely, a first heat dissipation path (the LED chip 110→the placement heat conduction member 161→the second heat conduction member 163→the first heat conduction member 162→the heat dissipation land pattern 323→the mounting substrate 320), and a second heat dissipation path (the LED chip 110→the placement heat conduction member 161→the third heat conduction member 164→the fourth heat conduction member 165→the first heat conduction member 162→the heat dissipation land pattern 323→the mounting substrate 320). The first and second heat dissipation paths are constituted by the combination of the placement heat conduction member 161 and the first heat conduction member 162 to the fourth heat conduction member 165.

Further, as heat dissipation paths for releasing heat generated by the LED chip 110 toward the mounting substrate 320, the following paths are formed, namely, a third heat dissipation path (the LED chip 110→the placement heat conduction member 161→the second heat conduction member 163→the first heat conduction member 162→the wax material 134→the heat dissipation land pattern 323→the mounting substrate 320), and a fourth heat dissipation path (the LED chip 110→the placement heat conduction member 161→the third heat conduction member 164→the fourth heat conduction member 165→the first heat conduction member 162→the wax material 134→the heat dissipation land pattern 323→the mounting substrate 320). The third and fourth heat dissipation paths are constituted by the combination of the placement heat conduction member 161, the first heat conduction member 162 to the fourth heat conduction member 165, and the wax material 134 that fills the first recess portion 123g.

In Embodiment 1, it is possible to efficiently release heat generated by the LED chip 110 toward the mounting substrate 320 via the above first to fourth heat dissipation paths, and thus it is possible to improve heat dissipation properties of the light-emitting device 100. Accordingly, it is also possible to easily deal with an increase in the size of a liquid crystal backlight device and the like.

Although the case where the placement heat conduction member 161 and the first heat conduction member 162 to the fourth heat conduction member 165 are provided in the light-emitting device 100 was described in the above, if the light-emitting device 100 has a configuration in which at least the first heat conduction member 162 is included, various modifications can be made. For example, as described above, a configuration can also be adopted in which the placement heat conduction member 161 is omitted, and the LED chip 110 is directly placed on the third heat conduction member 164. The light-emitting device 100 according to Embodiment 1 can form at least one of the first heat dissipation path to the fourth heat dissipation path.

As described above, the light-emitting device 100 according to Embodiment 1 is provided with the light-emitting element 110, and the package substrate 120 on which the light-emitting element 110 is placed. The package substrate 120 is provided with the placement face 121b on which the light-emitting element 110 is placed, the back face 124 that is opposed to the placement face 121b, and the mounting face 123 that is opposed, between the placement face 121b and the back face 124, to the mounting substrate 320 when the light-emitting device 100 is mounted, and is provided with the first recess portion 123g that extends, on the mounting face 123, from the back face 124 toward the placement face 121b and that has the first heat conduction member 162 formed on the surface thereof, and an intermediate heat conduction member (the second heat conduction member 163, the third heat conduction member 164, or the fourth heat conduction member 165) for conducting heat between the light-emitting element 110 and the first heat conduction member 162.

Accordingly, as a heat dissipation path for releasing heat generated by the light-emitting element 110 toward the mounting substrate 320, a heat dissipation path including the first heat conduction member 162 that is opposed to the mounting substrate 320, and the intermediate heat conduction member for conducting heat between the light-emitting element 110 and the first heat conduction member 162 is formed. Thereby, heat generated by the light-emitting element 110 can be efficiently released toward the mounting substrate 320, and thus it is possible to improve heat dissipation properties of the light-emitting device 100. Further, since the space that can be filled with the fixing wax material 134 with which the package substrate 120 is fixed to the mounting substrate 320 can be secured, the parallelism of the mounting face 123 relative to the mounting substrate 320 can be secured. Further, when the light-emitting device 100 (the mounting face 123) is mounted on the mounting substrate 320, light can be emitted in the side face direction.

Further, in the light-emitting device 100, the intermediate heat conduction member includes the second heat conduction member 163 that is connected to the first heat conduction member 162 and extends toward the light-emitting element 110 inside the package substrate 120. Accordingly, as a heat dissipation path for releasing heat generated by the light-emitting element 110 toward the mounting substrate 320, a heat dissipation path including the second heat conduction member 163 that is connected to the first heat conduction member 162 and extends toward the light-emitting element 110 inside the package substrate 120, and the first heat conduction member 162 that is connected to the second heat conduction member 163 is formed. Thereby, heat generated by the light-emitting element 110 can be efficiently released toward the mounting substrate 320, and thus heat dissipation properties of the light-emitting device 100 can be improved.

Further, the light-emitting device 100 is provided with the placement heat conduction member 161 on which the light-emitting element 110 is placed, and the placement heat conduction member 161 is connected to the second heat conduction member 163. Accordingly, as a heat dissipation path for releasing heat generated by the light-emitting element 110 toward the mounting substrate 320, a heat dissipation path including the placement heat conduction member 161 on which the light-emitting element 110 is placed, and the second heat conduction member 163 connected to the placement heat conduction member 161 is formed. Thereby, heat generated by the light-emitting element 110 can be efficiently released toward the mounting substrate 320, and thus heat dissipation properties of the light-emitting device 100 can be improved.

Further, in the light-emitting device 100, the placement heat conduction member 161 and the second heat conduction member 163 are integrally formed. Accordingly, since it is possible to integrally form the placement heat conduction member 161 and the second heat conduction member 163, heat conductivity can be improved, and the manufacturing process can be simplified. Note that integral formation means simultaneous formation with the application of the same member.

Further, in the light-emitting device 100, the intermediate heat conduction member includes the third heat conduction member 164 that is disposed from the placement face 121b up to the back face 124 inside the package substrate 120, and the fourth heat conduction member 165 that connects, on the back face 124, the third heat conduction member 164 and the first heat conduction member 162. Accordingly, as a heat dissipation path for releasing heat generated by the light-emitting element 110 toward the mounting substrate 320, a heat dissipation path including the third heat conduction member 164 that is disposed from the placement face 121b up to the back face 124 inside the package substrate 120, the fourth heat conduction member 165 that is disposed so as to connect, on the back face 124, the third heat conduction member 164 and the first heat conduction member 162, and the first heat conduction member 162 that is connected to the fourth heat conduction member 165 is formed. Thereby, heat generated by the light-emitting element 110 can be efficiently released toward the mounting substrate 320, and thus heat dissipation properties of the light-emitting device 100 can be improved.

Further, the light-emitting device 100 is provided with the placement heat conduction member 161 on which the light-emitting element 110 is placed, and the placement heat conduction member 161 is connected to the third heat conduction member 164. Accordingly, as a heat dissipation path for releasing heat generated by the light-emitting element 110 toward the mounting substrate 320, a heat dissipation path including the placement heat conduction member 161 on which the light-emitting element 110 is placed, and the third heat conduction member 164 connected to the placement heat conduction member 161 is formed. Thereby, heat generated by the light-emitting element 110 can be efficiently released toward the mounting substrate 320, and thus it is possible to improve heat dissipation properties of the light-emitting device 100.

Further, in the light-emitting device 100, the placement heat conduction member 161 and the third heat conduction member 164 are formed integrally. Accordingly, since it is possible to integrally form the placement heat conduction member 161 and the third heat conduction member 164, heat conductivity can be improved, and the manufacturing process can be simplified. Note that integral formation means simultaneous formation with the application of the same member.

Further, in the light-emitting device 100, the package substrate 120 is a ceramic substrate. Accordingly, since the package substrate 120 is constituted by a ceramic substrate, heat resistance properties can be improved, and reliability can be improved.

Further, in the light-emitting device 100, the first recess portion 123g is formed from the back face 124 side of the mounting face 123 to a position corresponding to the placement face 121b. Accordingly, since a flat face can be secured on the mounting face 123, the accuracy of mounting on the mounting substrate 320 can be secured.

Further, in the light-emitting device 100, the wall face 123h of the first recess portion 123g is formed so as to have an arc-shaped cross section. Accordingly, it is possible to easily form the first recess portion 123g.

Further, the light-emitting device 100 is provided with the internal anode terminal 141 and the internal cathode terminal 142 that are connected to the light-emitting element 110, the internal anode terminal 141 is connected to the external anode terminal 151 that is provided on the mounting face 123, and the internal cathode terminal 142 is connected to the external cathode terminal 152 that is provided on the mounting face 123. Accordingly, the internal anode terminal 141 and the internal cathode terminal 142 can be connected to wiring of the mounting substrate 320 via the external anode terminal 151 and the external cathode terminal 152.

Further, in the light-emitting device 100, the internal anode terminal 141 and the internal cathode terminal 142 each extend in the direction parallel to the placement face 121*b* of the light-emitting element 110. Accordingly, the package substrate 120 can be easily formed.

Further, in the light-emitting device 100, the external anode terminal 151 and the external cathode terminal 152 are each provided from the end on the back face 124 side of the mounting face 123 to a position corresponding to the placement face 121*b*. Accordingly, the accuracy with which the external anode terminal 151 and the external cathode terminal 152 are connected to the wiring of the mounting substrate 320 can be improved, and the reliability of connection can be secured.

Further, in the light-emitting device 100, the external anode terminal 151 and the external cathode terminal 152 are respectively provided on the second recess portions 123*b* and 123*e* formed in the corner portions 123*a* and 123*d* of the package substrate 120. Accordingly, the external anode terminal 151 and the external cathode terminal 152 can be easily connected to and aligned with the wiring of the mounting substrate 320.

Further, in the light-emitting device 100, the wall faces 123*c* and 123*f* of the second recess portions 123*b* and 123*e* are each formed so as to have an arc-shaped cross section. Accordingly, it is possible to easily form the second recess portions 123*b* and 123*e*.

Embodiment 2

A method for manufacturing a light-emitting device according to Embodiment 2 is described with reference to FIGS. 4 to 12. Note that with regard to the items in common with Embodiment 1, the same reference numerals are employed where appropriate.

In Embodiment 2, a description is given on a procedure of manufacturing the light-emitting device 100 according to Embodiment 1 using two green sheet groups (a first green sheet group 210 formed by laminating four green sheets, and a second green sheet group 230 formed by laminating four green sheets). The first green sheet group 210 and the second green sheet group 230 are laminated and fired so as to form a ceramic substrate 200 in an aggregate state (state in which a large number of the ceramic substrates 120 are simultaneously formed), which serves as the base material of the ceramic substrate 120.

Figure 4:
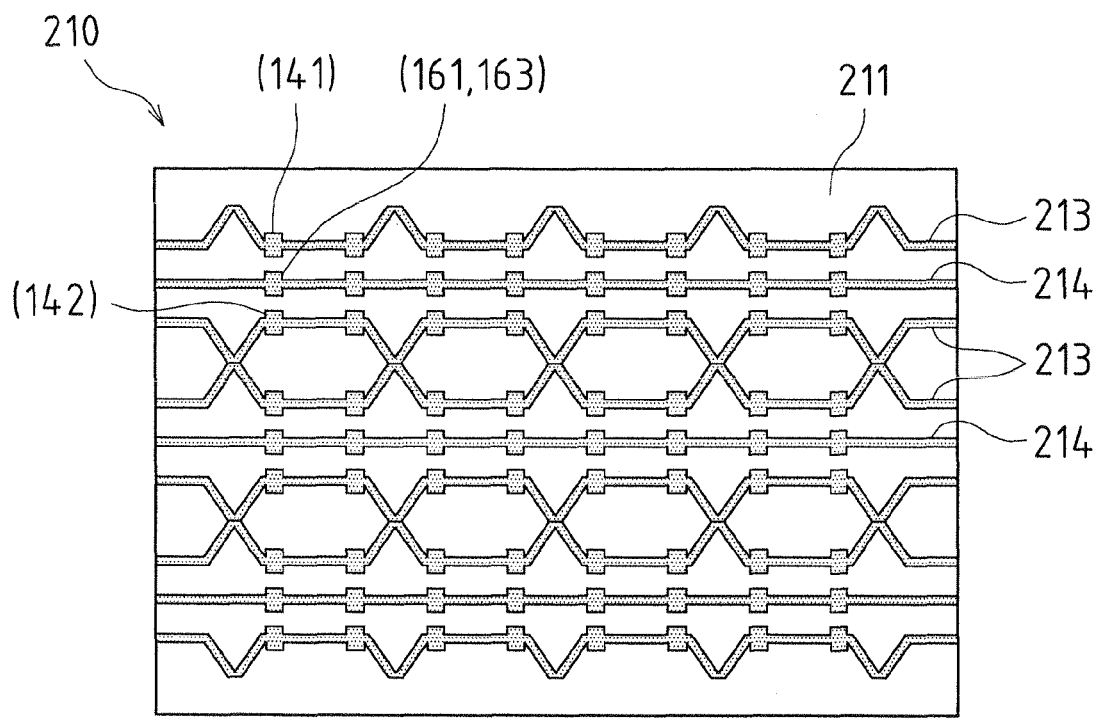
FIG. 4 is a plan view schematically showing a conceptual disposition, with respect to the surface, of wiring patterns formed on a first green sheet group used in a method for manufacturing a light-emitting device according to Embodiment 2.

FIG. 4 is a plan view schematically showing conceptual disposition, with respect to a face 211, of wiring patterns formed on the first green sheet group 210 used in the method for manufacturing a light-emitting device according to Embodiment 2. In the actual process, wiring patterns are formed in the state where holes have been made, and thus the state will be as shown in FIG. 5.

As shown in FIG. 4, a wiring pattern 213 that corresponds to the internal anode terminal 141 and the internal cathode terminal 142, and a wiring pattern 214 that corresponds to the placement heat conduction member 161 and the second heat conduction member 163 are each formed on the surface 211 of the first green sheet group 210, using plated conduction lines. The wiring pattern 213 is formed by connecting a plurality of wiring patterns corresponding to the internal anode terminal 141 and a plurality of wiring patterns corresponding to the internal cathode terminal 142. Further, the wiring pattern 214 is formed by connecting a plurality of wiring patterns corresponding to the placement heat conduction member 161 and a plurality of wiring patterns corresponding to the second heat conduction member 163.

Figure 5:
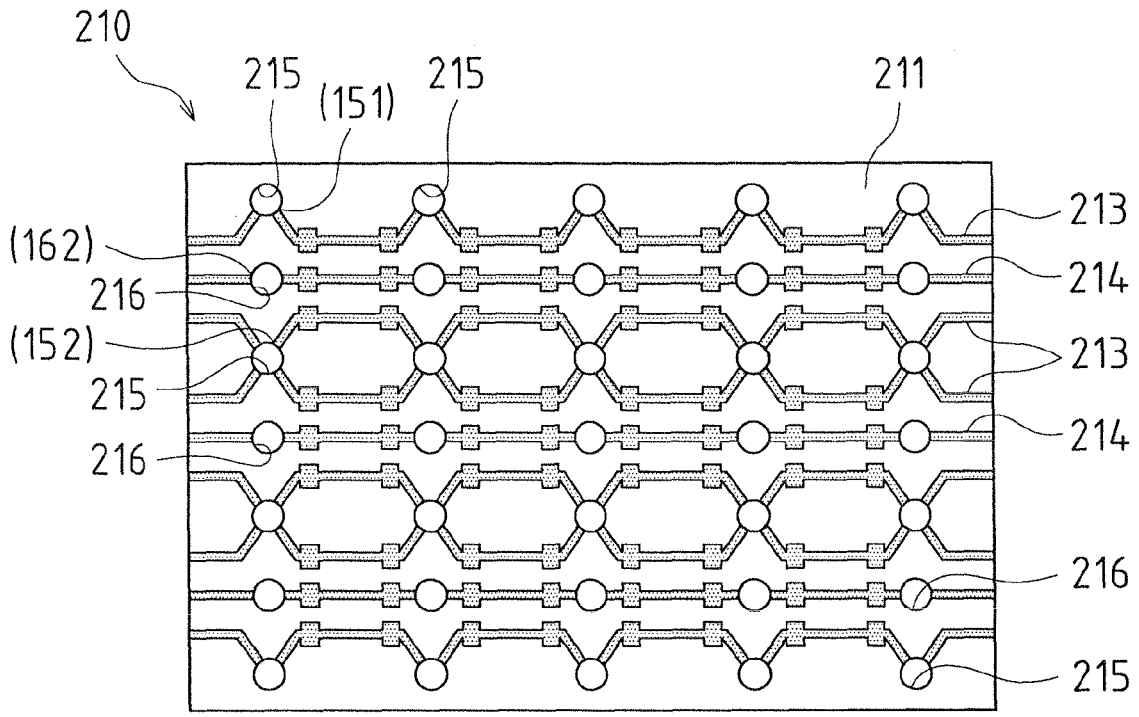
FIG. 5 is a plan view schematically showing the state of the surface when through holes have been formed in the first green sheet group, and the wiring patterns have been formed thereon.
Figure 6:
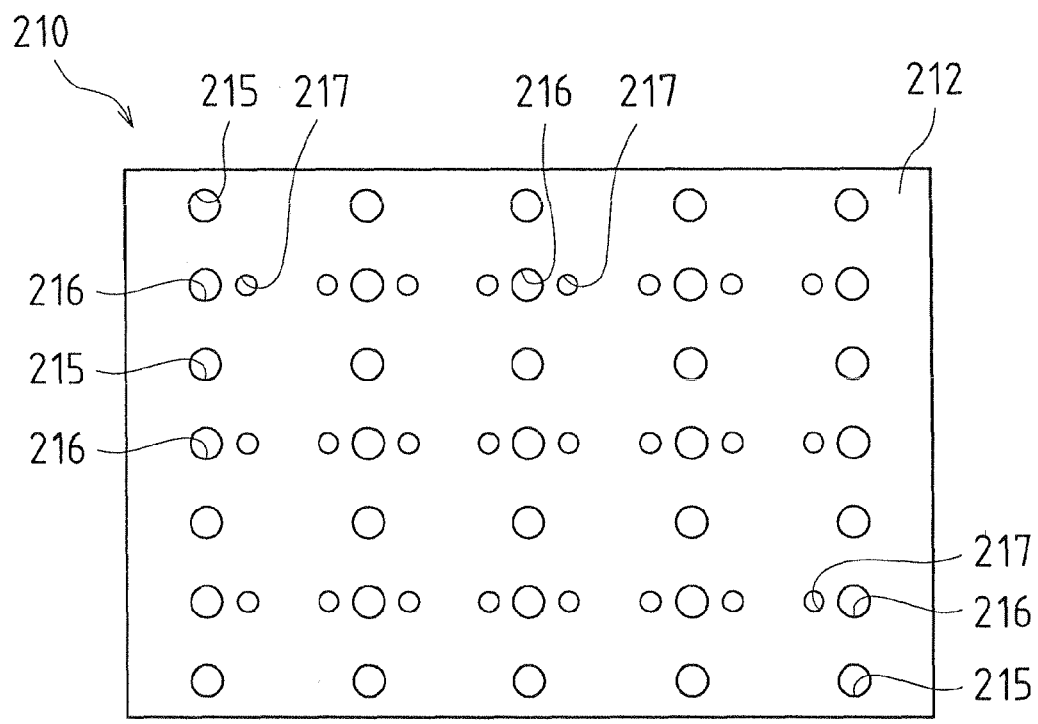
FIG. 6 is a bottom view schematically showing the state of disposition of the through holes (openings) formed before the state shown in FIG. 5, as the state of the back face of the first green sheet group.

FIG. 5 is a plan view schematically showing the state of the surface 211 when through holes have been formed in the first green sheet group 210, and the wiring patterns have been formed thereon. FIG. 6 is a bottom view schematically showing the state of disposition of the through holes (openings) formed before the state shown in FIG. 5, as the state of a back face 212 of the first green sheet group 210.

As shown in FIG. 5, a plurality of through holes 215 for forming the external anode terminals 151 and the external cathode terminals 152 are disposed in the first green sheet group 210. Further, a plurality of through holes 216 for forming the first heat conduction members 162 are disposed in the first green sheet group 210. The through holes 215 and 216 are regularly disposed such that they are repeated alternately in a column direction (lengthwise direction in FIG. 5). The through holes 215 are created in advance in the part where the wiring pattern 213 is provided. The through holes 216 are formed in advance in the part where the wiring pattern 214 is provided.

Further, as shown in FIG. 6, a plurality of openings 217 for forming the third heat conduction member 164 are formed in advance in the back face 212 of the first green sheet group 210. The openings 217 are formed so as to reach the wiring pattern 214 corresponding to the placement heat conduction member 161.

Figure 7:
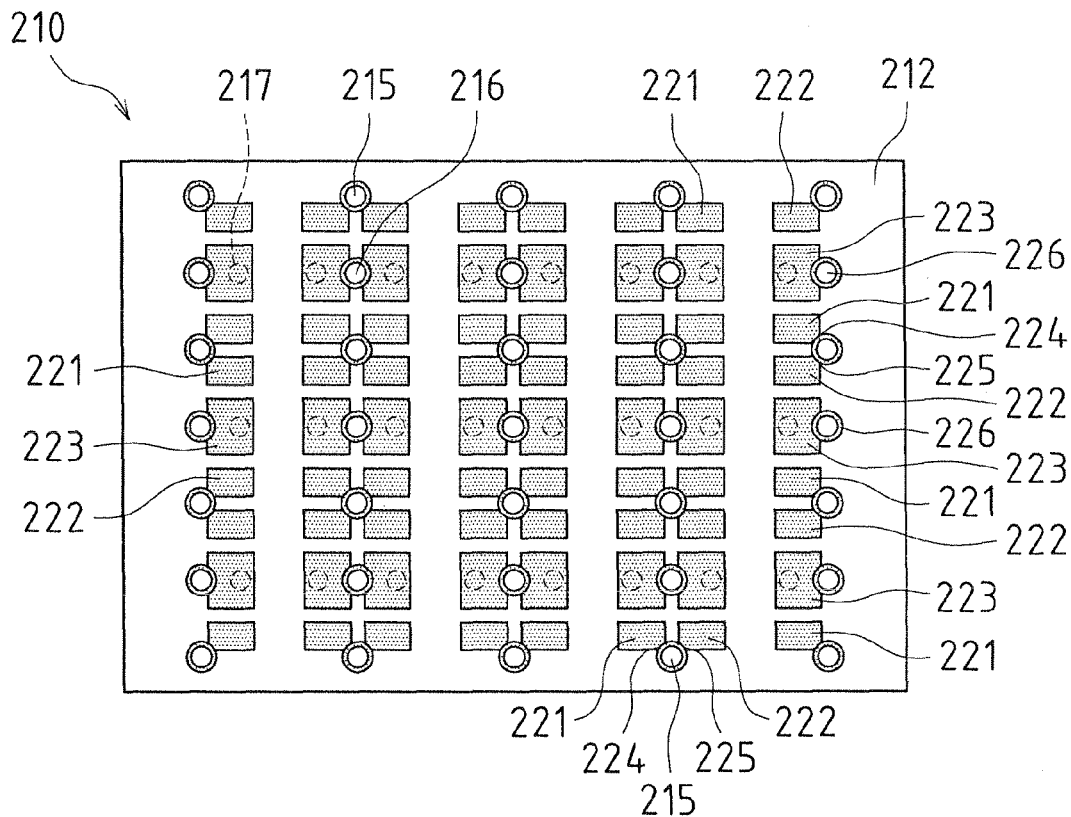
FIG. 7 is a bottom view schematically showing the state of the back face when electrodes and the like have been formed on the first green sheet group after the state shown in FIG. 5.

FIG. 7 is a bottom view schematically showing the state of the back face 212 when electrodes and the like have been formed on the first green sheet group 210 after the state shown in FIG. 5.

As shown in FIG. 7, the openings 217 are filled with, for example, metal paste made of a metal with high heat conductivity such as Cu. This metal paste serves as the third heat conduction member 164. Note that the back face 212 side of the openings 217 is closed off by back face members 223.

Then, back face electrodes 221 corresponding to back face anode terminals, back face electrodes 222 corresponding to back face cathode terminals, and the back face members 223 corresponding to the fourth heat conduction members 165 are each formed on the back face 212 of the first green sheet group 210 by performing screen printing.

Further, inner wall electrodes 224 are formed on the inner walls of the through holes 215 so as to connect the wiring patterns 213 corresponding to the internal anode terminals 141 on the surface 211 and the back face electrodes 221 on the back face 212. Inner wall electrodes 225 are formed on the inner walls of the through holes 215 so as to connect the wiring patterns 213 corresponding to the internal cathode terminals 142 on the surface 211 and the back face electrodes 222 on the back face 212. Inner wall members 226 are formed on the inner walls of the through holes 216 so as to connect the wiring patterns 214 corresponding to the second heat conduction members 163 on the surface 211 and the back face members 223 on the back face 212.

Figure 8:
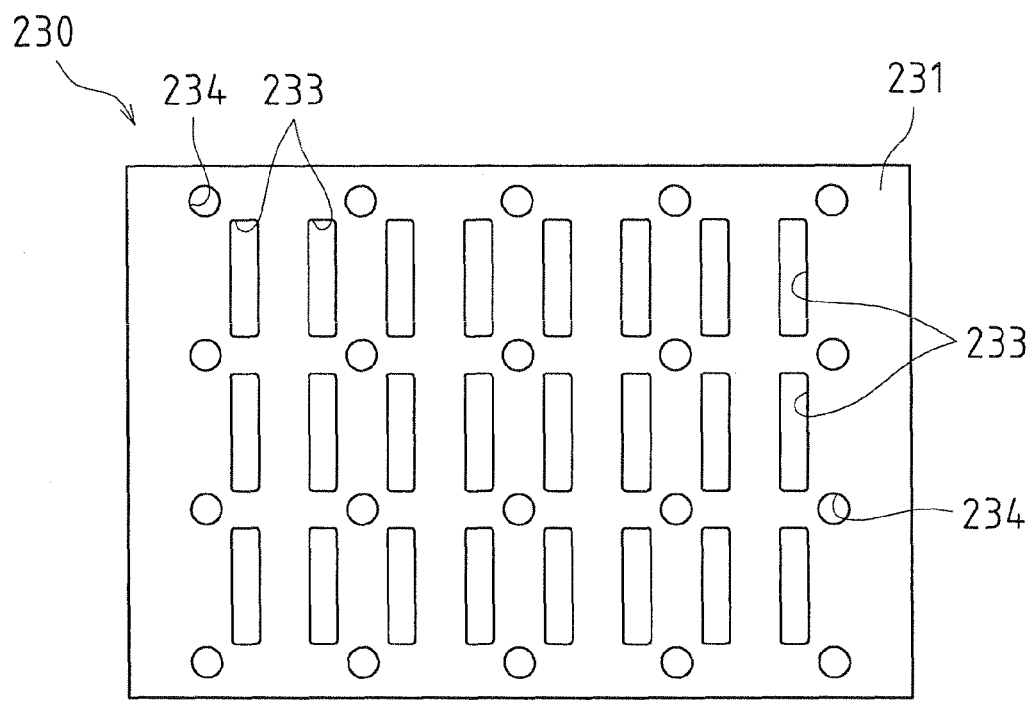
FIG. 8 is a plan view schematically showing the state of the surface when through holes have been formed in a second green sheet group used in the method for manufacturing a light-emitting device according to Embodiment 2.
Figure 9:
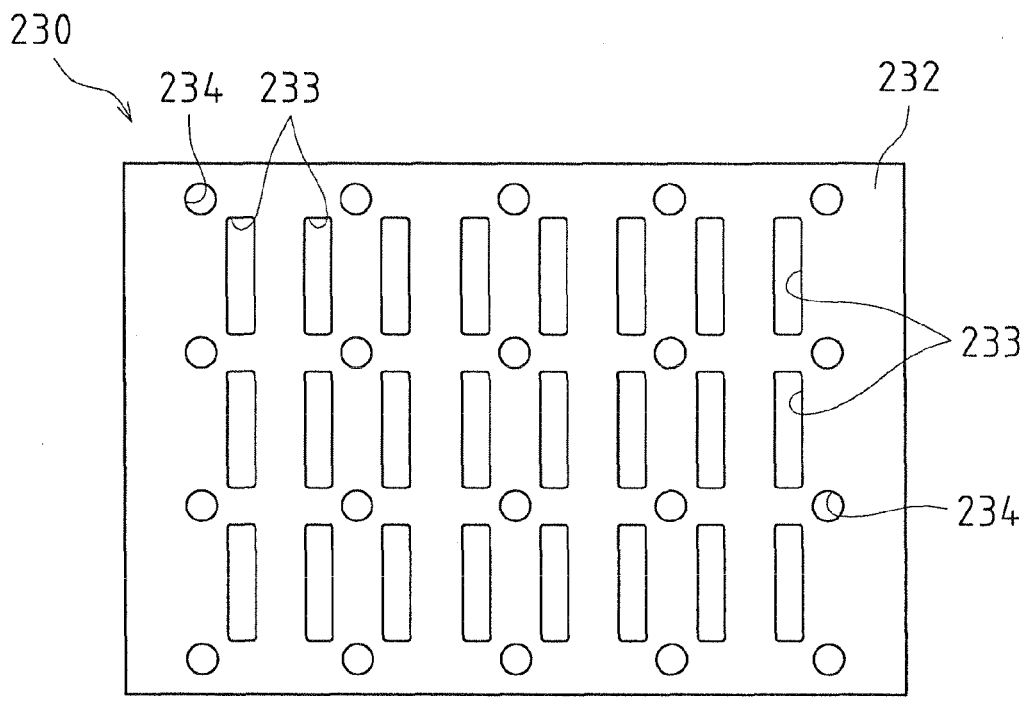
FIG. 9 is a bottom view schematically showing the state of the back face likewise when the through holes have been formed in the second green sheet group.

FIG. 8 is a plan view schematically showing the state of a surface 231 when through holes have been formed in the second green sheet group 230 that is used in the method for manufacturing a light-emitting device according to Embodiment 2. FIG. 9 is a bottom view schematically showing the state of a back face 232 likewise when through holes have been formed in the second green sheet group 230.

As shown in FIGS. 8 and 9, a plurality of through holes 233 corresponding to the chip recess portions 121 are formed in the second green sheet group 230. Then, the reflecting layer 131 is formed on the inner wall of each of the through holes 233, by applying, for example, Ag paste or the like. Further, a plurality of through holes 234 corresponding to the through holes 215 in the first green sheet group 210 are formed in the second green sheet group 230.

Next, the back face 232 of the second green sheet group 230 is superposed on the surface 211 of the first green sheet group 210, both the surface 211 and the back face 232 are adhered together, and both the sheet groups 210 and 230 are laminated. At this time, the wiring pattern 214 corresponding to the placement heat conduction member 161 on the first green sheet group 210, and the wiring pattern 213 corresponding to the internal anode terminal 141 and the internal cathode terminal 142 are disposed in each of the through holes 233 in the second green sheet group 230 (see FIG. 10). Further, the through holes 215 in the first green sheet group 210 and the through holes 234 in the second green sheet group 230 communicate with each other.

Note that a glass coat as a protective layer may be applied to the surface 211 of the first green sheet group 210 (except the surface on which the LED chip 110 is mounted), which serves as the bottom face of the through holes 233 in the second green sheet group 230, and the surface of each of the reflecting layers 131 of the second green sheet group 230.

Next, a metal underlayer used as an underlayer of an Au plating layer described later is respectively formed on the surfaces (inner wall faces) of the inner wall electrodes 224 and 225 and the inner wall members 226 that are formed on the inner walls of the through holes 215 and 216 of the first green sheet group 210.

Figure 10:
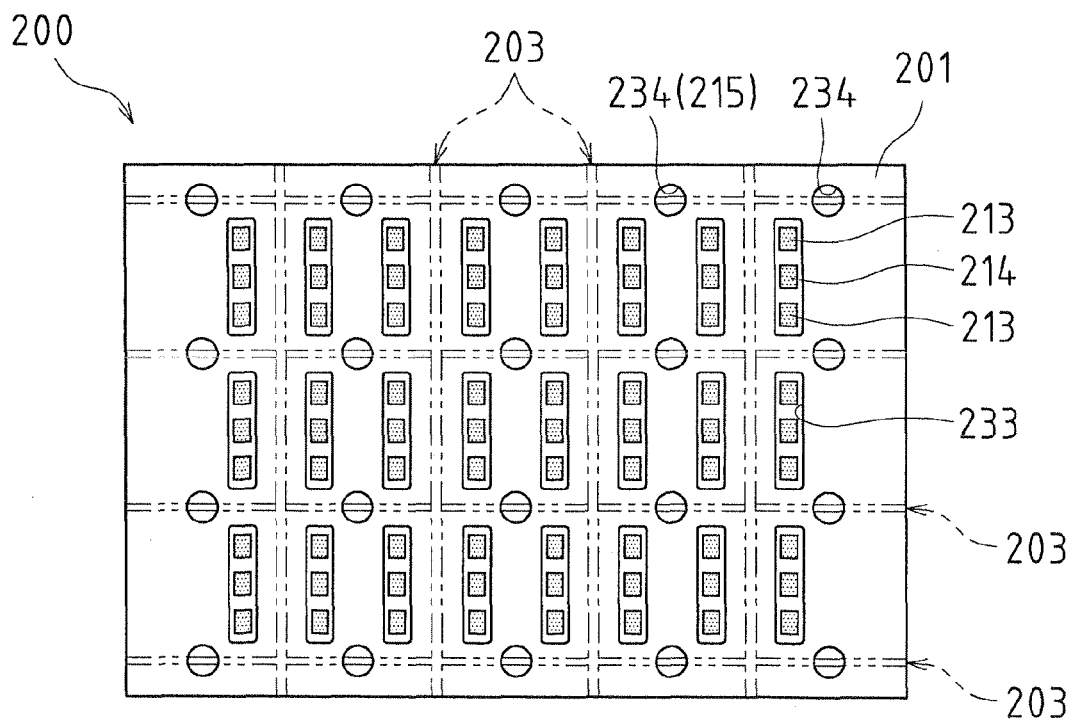
FIG. 10 is a plan view schematically showing the state of the surface of a ceramic substrate obtained after laminating and firing the first and second green sheet groups.
Figure 11:
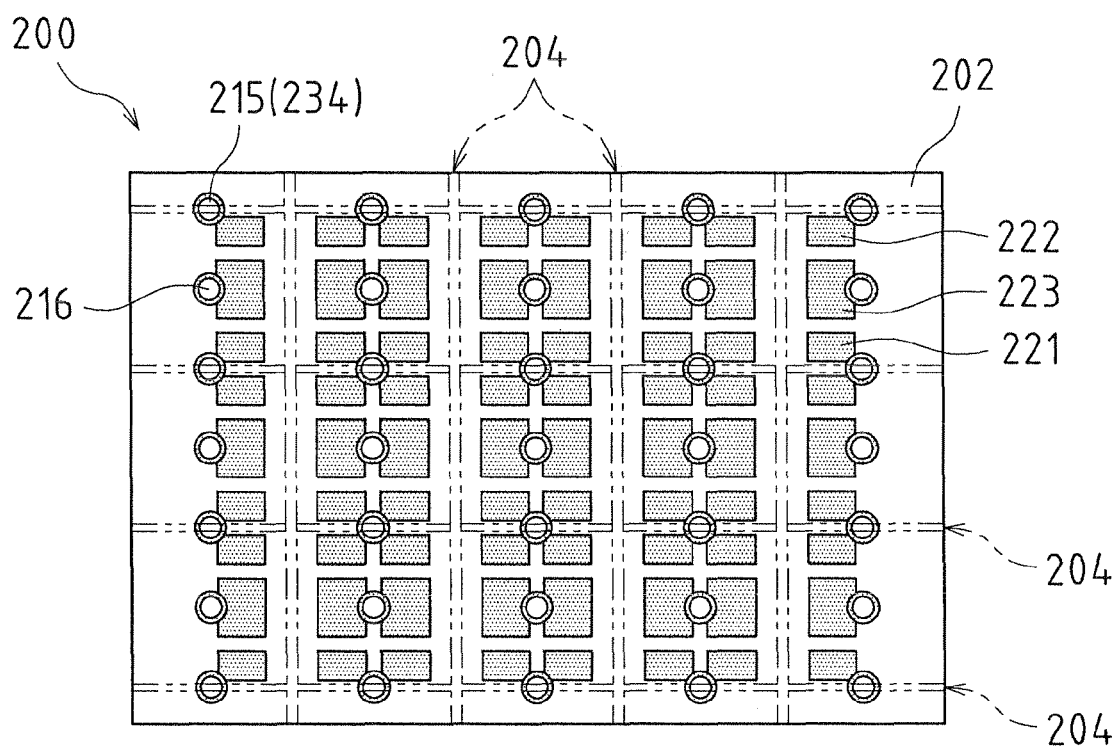
FIG. 11 is a bottom view schematically showing the state of the back face of the ceramic substrate obtained after laminating and firing the first and second green sheet groups.

FIG. 10 is a plan view schematically showing the state of a surface 201 of the ceramic substrate 200 after laminating and firing the first and second green sheet groups 210 and 230. FIG. 11 is a bottom view schematically showing the state of a back face 202 of the ceramic substrate 200 after laminating and firing the first and second green sheet groups 210 and 230. Note that in FIGS. 10 and 11, dividing grooves 203 and 204 for division are shown by two-dot chain lines.

As shown in FIGS. 10 and 11, the dividing grooves 203 and 204 are formed in the surface 201 and the back face 202 of the ceramic substrate 200, and thereafter the first green sheet group 210 and the second green sheet group 230 that are laminated are fired and hardened. A metal underlayer used as an underlayer of the back face anode terminal, the back face cathode terminal, and the second heat conduction member 163 is respectively formed, by performing screen printing, on the back face electrodes 221 and 222 and the back face members 223 of the back face 202 of the ceramic substrate 200 that has been formed in the above way (the aggregate of the ceramic substrate 120).

Next, an Au plating layer is formed on the metal underlayer formed on each of the inner walls of the through holes 215 and 216. Thereby, the external anode terminal 151, the external cathode terminal 152, and the first heat conduction member 162 are formed. Further, an Au plating layer is formed on each of the metal underlayers formed on the back face 202 of the ceramic substrate 200. Thereby, the back face anode terminal, the back face cathode terminal, and the fourth heat conduction member 165 are formed.

Next, the LED chip 110 is die-bonded to the placement heat conduction member 161. The P side electrode 111 and the N side electrode 112 that are formed on the surface of the LED chip 110 are respectively wire-bonded to the internal anode terminal 141 and the internal cathode terminal 142 with the wires 143.

Next, each of the chip recess portions 121 formed by the through holes 233 in the second green sheet group 230 is filled with the fluorescent material-containing resin 133, and the resin is hardened.

Figure 12:
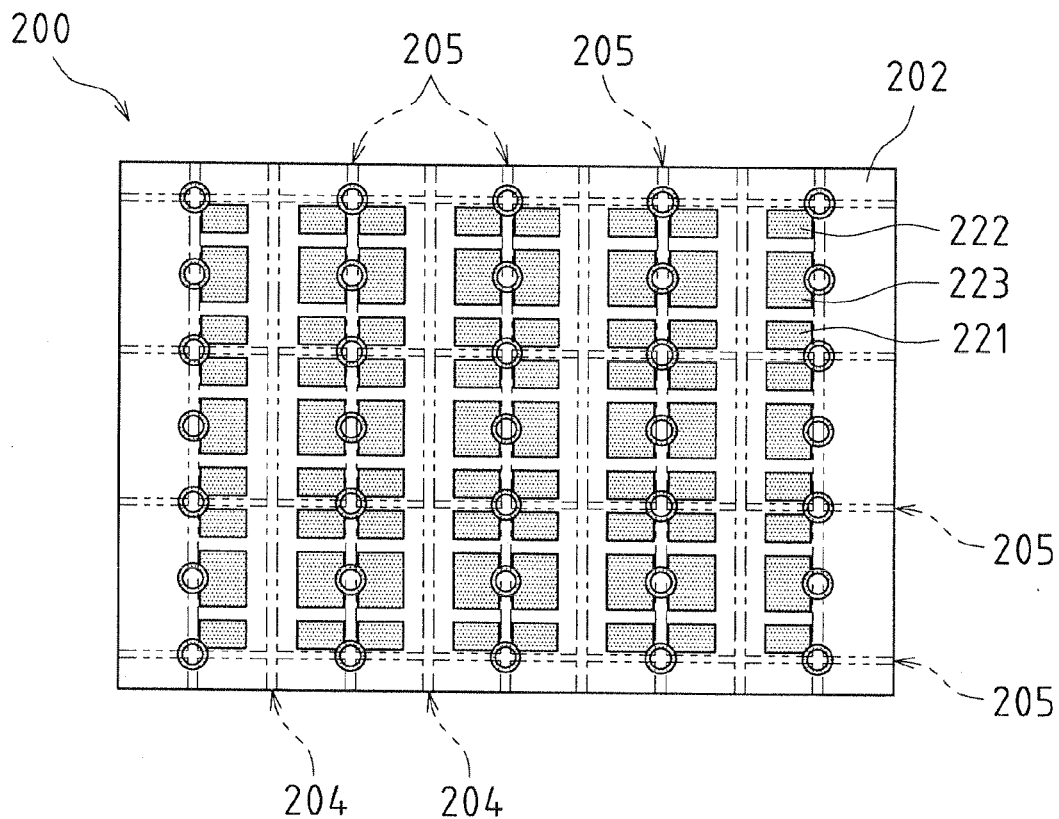
FIG. 12 is a bottom view schematically showing the state of the back face of the ceramic substrate to be sectioned by dicing.

FIG. 12 is a bottom view schematically showing the state of the back face 202 of the ceramic substrate 200 to be sectioned by dicing. In FIG. 12, section lines 205 are shown by two-dot chain lines.

As shown in FIG. 12, the ceramic substrate 200 is sectioned after forming the dividing grooves 203 and 204. At this time, the face that is to serve as the mounting face 123 is sectioned by blade dicing. Thus, the mounting face 123 can be made flat as a result of forming the mounting face 123 by blade dicing. Consequently, the mounting face 123 can be brought into contact with the land pattern face of the mounting substrate 320 with no gap therebetween, and the light emission face of the light-emitting device 100 can be made parallel to the mounting substrate 320.

After that, the ceramic substrate 200 is divided into the individual ceramic substrate 120 along the dividing grooves 203 and 204, and thereby completed products of the packages of the light-emitting device 100 can be obtained.

Note that the initial characteristics of the light-emitting device 100 may be checked as necessary by bringing an inspection terminal into contact with the back face anode terminal and the back face cathode terminal on the back face 124 of the ceramic substrate 120.

Embodiment 3

A light-emitting device according to Embodiment 3 is described with reference to FIGS. 13 and 14. Note that with regard to the items in common with Embodiments 1 and 2, the same reference numerals are employed where appropriate.

Figure 13:
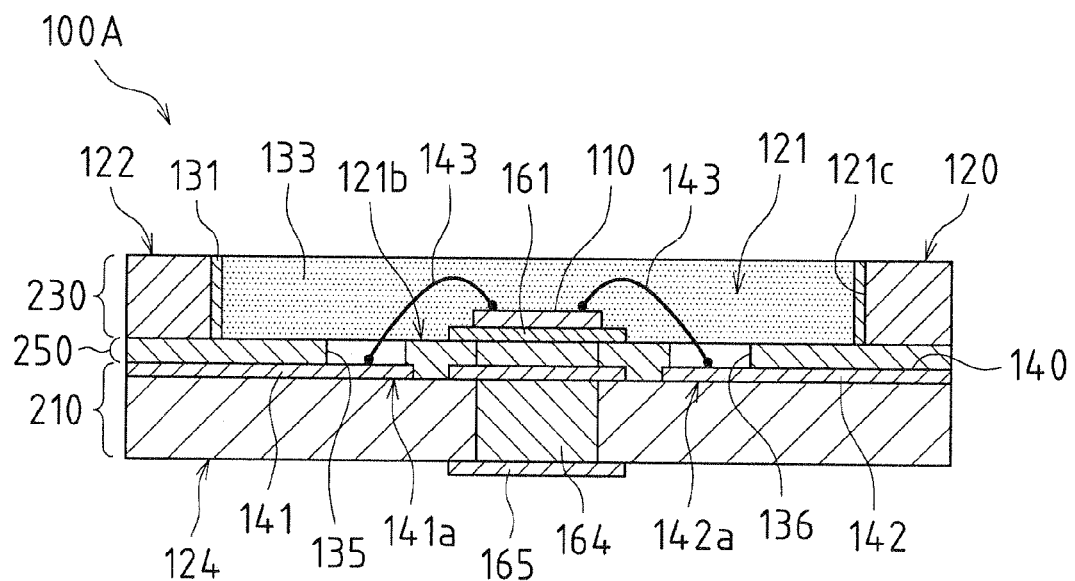
FIG. 13 is a cross-sectional view schematically showing a light-emitting device according to Embodiment 3.
Figure 14:
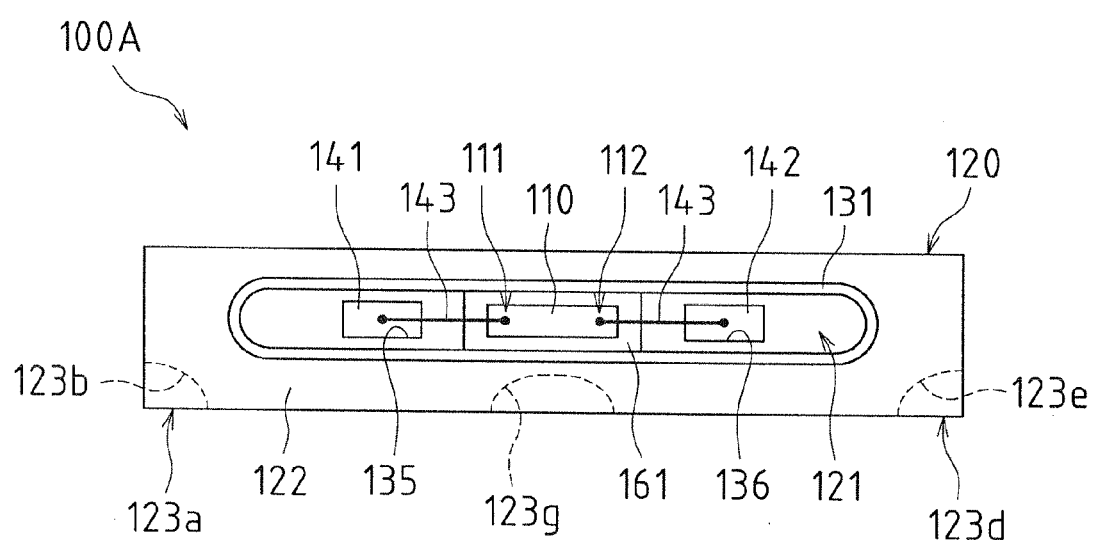
FIG. 14 is a diagram of the light-emitting device shown in FIG. 13 viewed from the opening face side.

FIG. 13 is a cross-sectional view schematically showing a light-emitting device according to Embodiment 3. FIG. 14 is a lateral view of the light-emitting device shown in FIG. 13 seen from the opening face side.

Although a light-emitting device 100A according to Embodiment 3 has substantially the same configuration as that of the light-emitting device 100 according to Embodiment 1, the difference from the light-emitting device 100 according to Embodiment 1 is that a difference in level is provided between the placement face 121*b* on which the LED chip 110 is placed and an internal terminal plane 140 constituted by the internal anode terminal 141 and the internal cathode terminal 142.

In the light-emitting device 100A, the internal terminal plane 140 constituted by the internal anode terminal 141 and the internal cathode terminal 142 is provided closer to the back face 124 than the surface of the placement heat conduction member 161 serving as the placement face on which the LED chip 110 is placed is.

To be specific, recess portions 135 and 136 are provided in the placement face 121*b* of the chip recess portion 121 of the ceramic substrate 120. The inner end portion 141*a* of the internal anode terminal 141 is disposed on the bottom face of the recess portion 135. An end of the wire 143 connected to the P side electrode 111 of the LED chip 110 is disposed inside the recess portion 135.

Further, the inner end portion 142*a* of the internal cathode terminal 142 is disposed on the bottom face of the recess portion 136. An end of the wire 143 connected to the N side electrode 112 of the LED chip 110 is disposed inside the recess portion 136.

Since the internal anode terminal 141 and the internal cathode terminal 142 are disposed in this manner on the back face 124 side at a lower position than the placement face 121b of the chip recess portion 121, a ceramic layer can be reliably interposed between the reflecting layer 131 formed on the inner wall face 121c of the chip recess portion 121 and the internal anode terminal 141 and the internal cathode terminal 142. Thereby, it is possible to easily prevent the internal anode terminal 141 and the internal cathode terminal 142 from short-circuiting via the reflecting layer 131 (for example, Ag).

Note that as a method for manufacturing the light-emitting device 100A according to Embodiment 3, in order to form the difference in level described above, it is sufficient to use a third green sheet group 250 to be provided between the first green sheet group 210 and the second green sheet group 230, in addition to the first green sheet group 210 and the second green sheet group 230 of Embodiment 2. Specifically, a plurality of through holes for wire bonding may be formed in the third green sheet group 250 (the holes appear as the recess portion 135 and the recess portion 136 in the light-emitting device 100A), and wiring patterns corresponding to the internal anode terminal 141 and the internal cathode terminal 142 may be formed on the surface 211 of the first green sheet group 210 so as to close off the opening of each through hole.

As described above, in the light-emitting device 100A according to Embodiment 3, the difference in level is provided between the placement face 121b of the light-emitting element 110 and the internal terminal plane 140 constituted by the internal anode terminal 141 and the internal cathode terminal 142. Accordingly, the internal anode terminal 141 and the internal cathode terminal 142 can be easily prevented from short-circuiting.

Further, in the light-emitting device 100, the internal terminal plane 140 is disposed closer to the back face 124 than the placement face 121b on which the light-emitting element 110 is placed is. Accordingly, the package substrate 120 can be easily formed.

Embodiment 4

Figure 15:
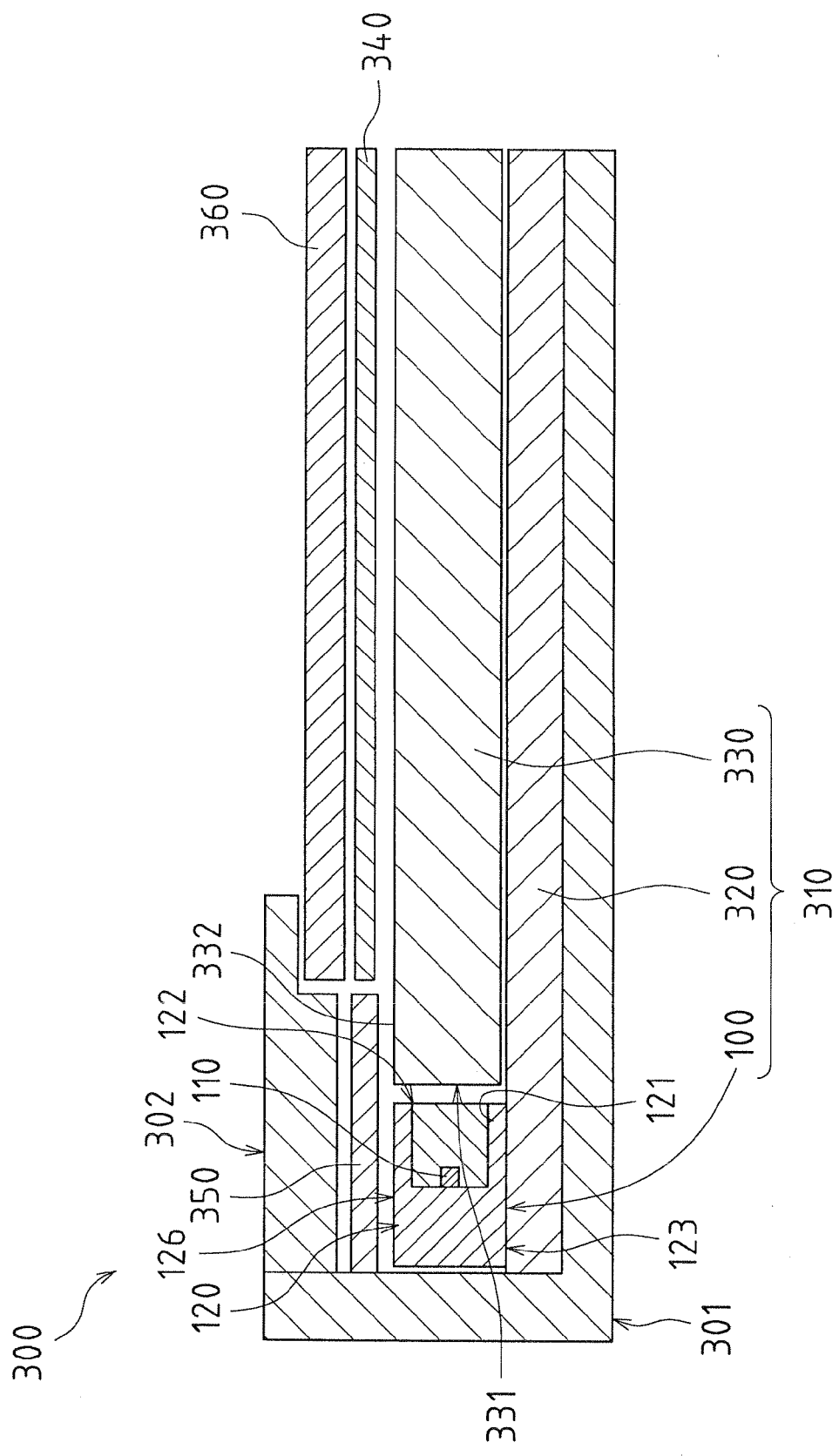
FIG. 15 is a cross-sectional view schematically showing a planar light source and a liquid crystal display device, according to Embodiment 4.

A description is given on a planar light source and a liquid crystal display device to which the planar light source is applied as a backlight, according to Embodiment 4 with reference to FIG. 15. Note that with regard to the items in common with Embodiments 1 to 3, the same reference numerals are employed where appropriate.

FIG. 15 is a cross-sectional view schematically showing a planar light source and a liquid crystal display device according to Embodiment 4.

A liquid crystal display device 300 is provided with a planar light source 310 and a liquid crystal panel 360. The planar light source 310 is provided with the light-emitting device 100, the mounting substrate 320 on which the light-emitting device 100 is mounted, and a light guide plate 330 that is disposed facing the mounting substrate 320 with an end face 331 being opposed to the opening face 122 of the light-emitting device 100. As the light-emitting device 100, a side light-emitting type device as described above is used. Since the light-emitting device 100 has excellent heat dissipation properties as described above, it is possible to constitute the planar light source 310 with excellent heat dissipation properties and high reliability.

With the liquid crystal display device 300, a mounting substrate of the planar light source 310 is supported by a device casing 301, and the plurality of land patterns 321 to 323 are arranged along one end of the mounting substrate 320, from the near side to the far side in the figure. The land patterns 321 to 323 include the electrode land patterns 321 and 322 and the heat dissipation land pattern 323 of the light-emitting device 100 (see FIG. 2). On the land patterns 321, 322, and 323 on the mounting substrate 320, the mounting face 123 of the light-emitting device 100 is fixed using the wax material 134, via the external anode terminal 151, the external cathode terminal 152, and the first heat conduction member 162.

On the opening face 122 side of the light-emitting device 100, the plate-shaped light guide plate 330 is disposed in parallel to the mounting substrate 320 with a prescribed spacing between the light guide plate 330 and the opening face 122. Above the light guide plate 330, an optical sheet 340 such as a diffusion sheet for diffusing light taken out from the upper face of the light guide plate 330 so as to uniformize its intensity and chromaticity, and/or a condensing sheet for aligning the direction of diffused light so as to be upward and taking out the light is disposed. Furthermore, the liquid crystal panel 360 is disposed above the optical sheet 340.

Further, a reflecting sheet 350 is disposed above a face 126 that is on the side opposite to the mounting face 123 of the light-emitting device 100. The reflecting sheet 350 extends up to above an end portion 332 of the light guide plate 330 on the light-emitting device 100 side. The reflecting sheet 350 is configured to be covered with a frame portion 302 of the device casing 301.

As described above, the planar light source 310 according to Embodiment 4 is provided with the light-emitting device 100 or 100A according to Embodiment 1 or 3 described above, or a light-emitting device 500 or 600 according to Embodiment 5 or 6 described later (hereinafter, simply referred to as the light-emitting device 100), the mounting substrate 320 on which the light-emitting device 100 is mounted, and the light guide plate 330 for guiding light from the light-emitting device 100. The first recess portion 123g is filled with the wax material 134 for fixing the package substrate 120 to the mounting substrate 320 (see FIG. 1).

Accordingly, as a heat dissipation path for releasing heat toward the mounting substrate 320, a heat dissipation path for releasing heat toward the mounting substrate 320 via the wax material 134 is constituted, and thus heat dissipation properties can be improved. Further, since the first recess portion 123g is filled with the wax material 134, positioning of the mounting face 123 with respect to the mounting substrate 320 is performed with high accuracy, and the uniformity of light that exits from the light guide plate 330 can be improved.

Further, the planar light source 310 is provided with the light-emitting device 100, the mounting substrate 320 on which the light-emitting device 100 is mounted, and the light guide plate 330 for guiding light from the light-emitting device 100. The second recess portions 123b and 123e are filled with the wax material 134 for fixing the package substrate 120 to the mounting substrate 320 (see FIGS. 2 and 3, and Embodiment 1).

Accordingly, as a heat dissipation path for releasing heat toward the mounting substrate 320, a heat dissipation path for releasing heat toward the mounting substrate 320 via the wax material 134 is constituted, and thus heat dissipation properties can be improved. Further, since the second recess portions 123b and 123e are filled with the wax material 134, positioning of the mounting face 123 with respect to the mounting substrate 320 is performed with high accuracy, and the uniformity of light that exits from the light guide plate 330 can be improved.

As described above, the liquid crystal display device 300 according to Embodiment 4 is provided with the planar light source 310 and the liquid crystal panel 360 according to Embodiment 4, and the planar light source 310 is used as a backlight of the liquid crystal panel 360. Accordingly, since the planar light source 310 having good heat dissipation properties and excellent light uniformity is used as a backlight, the liquid crystal display device 300 that can perform uniform display with high accuracy can be achieved.

Embodiment 5

The light-emitting device 500 according to Embodiment 5 is described with reference to FIGS. 16 and 17. Note that with regard to the items in common with Embodiment 1, similar reference numerals are employed where appropriate (see FIGS. 1 to 3). Note that items given reference numerals in the hundreds in Embodiment 1 are given reference numerals in the five hundreds in Embodiment 5.

Figure 16:
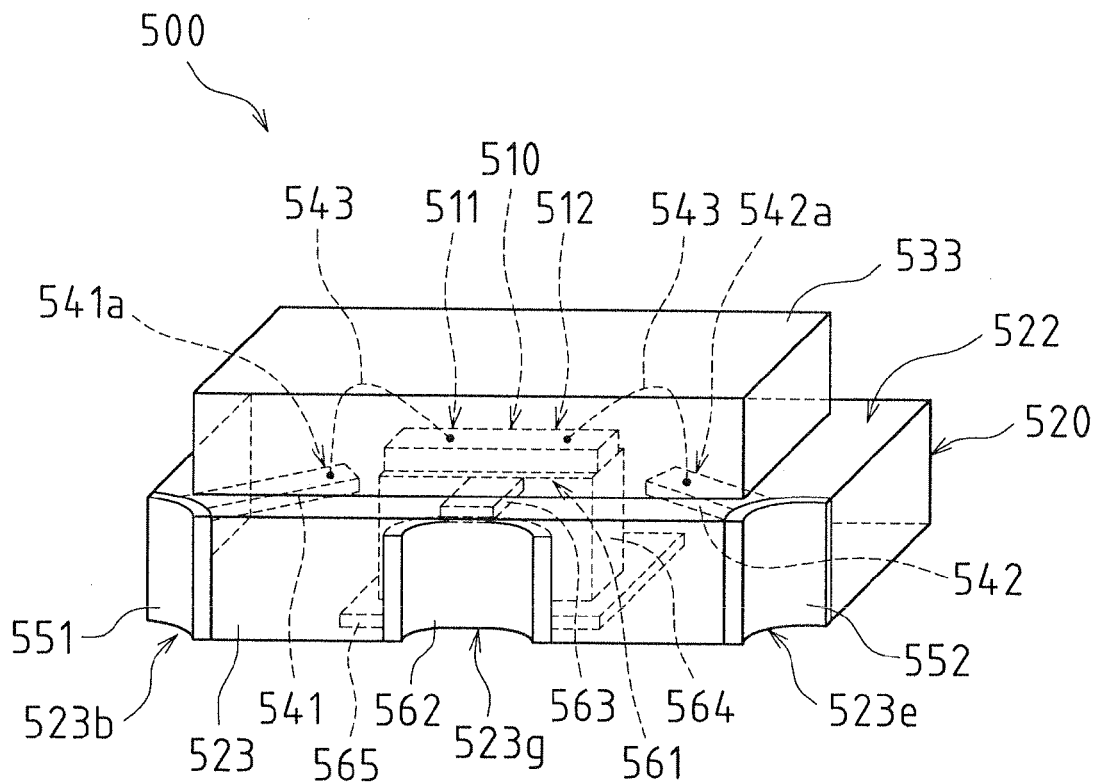
FIG. 16 is a perspective view conceptually showing a light-emitting device according to Embodiment 5 that is seen obliquely from below.
Figure 17:
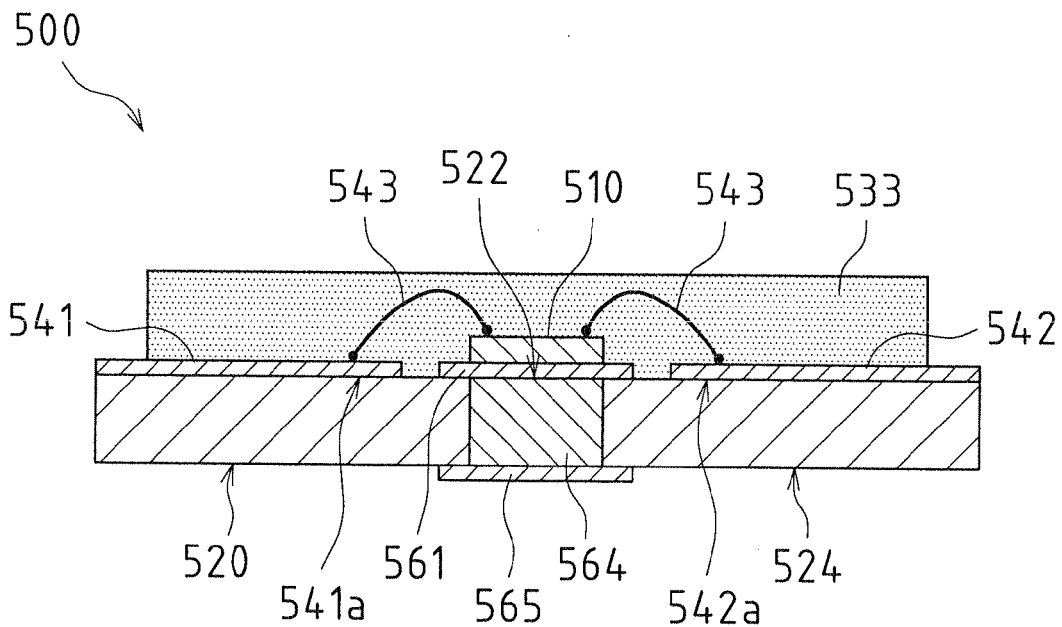
FIG. 17 is a cross-sectional view schematically showing the light-emitting device according to Embodiment 5.

FIG. 16 is a perspective view conceptually showing the light-emitting device 500 according to Embodiment 5 that is seen obliquely from below. FIG. 17 is a cross-sectional view schematically showing the light-emitting device 500 according to Embodiment 5.

The difference of the light-emitting device 500 according to Embodiment 5 compared to the light-emitting device 100 according to Embodiment 1 and the like is that the chip recess portion on which the reflecting layer that reflects light from the LED chip is formed is omitted.

To be specific, the light-emitting device 500 is provided with an LED chip 510 and a ceramic substrate 520.

The LED chip described in Embodiment 1 can be used as the LED chip 510. A P side electrode 511 and an N side electrode 512, which are a pair of pad electrodes, are formed on the surface of the LED chip 510. The P side electrode 511 is wire-bonded to an internal anode terminal 541 via a wire 543. The N side electrode 512 is wire-bonded to an internal cathode terminal 542 via a wire 543.

The ceramic substrate 520 is a package substrate formed in a substantially rectangular solid shape. The ceramic substrate 520 is provided with a placement face 522, which is the surface on which the LED chip 510 is disposed, a mounting face 523 that is adjacent to the placement face 522 and is opposed to the mounting substrate 320, and a back face 524 provided on the side opposite to the placement face 522. Both the placement face 522 and the back face 524 are formed perpendicularly to the mounting face 523.

A placement heat conduction member 561 is provided on the placement face 522, and the LED chip 510 is placed on the placement heat conduction member 561. The internal anode terminal 541 and the internal cathode terminal 542 are placed on the placement face 522. The internal anode terminal 541, the internal cathode terminal 542, and the placement heat conduction member 561 are disposed so as to be separated from each other.

A sealing portion of a fluorescent material-containing resin 533 is formed on the placement face 522. Accordingly, the LED chip 510 is covered with the fluorescent material-containing resin 533. As a fluorescent material, the fluorescent material described in Embodiment 1 can be used.

The internal anode terminal 541 is a thin metal layer, and is formed as a wiring pattern. The internal anode terminal 541 is connected to an external anode terminal 551 provided on the mounting face 523 of the ceramic substrate 520. The external anode terminal 551 is provided on a second recess portion 523b formed in a corner portion 523a of the mounting face 523.

Specifically, the second recess portion 523b is formed in the corner portion 523a of the mounting face 523, and the second recess portion 523b extends from the end on the placement face 522 side up to the end on the back face 524 side. A wall face 523c of the second recess portion 523b is formed so as to have an arc-shaped cross section. Note that the cross sectional shape of the wall face 523c of the second recess portion 523b may be other than the arc shape.

The external anode terminal 551 is formed on the wall face 523c of the second recess portion 523b. The external anode terminal 551 is formed from the end on the back face 524 side of the second recess portion 523b up to the end on the placement face 522 side. The external anode terminal 551 is connected to the electrode land pattern 321 formed on the mounting substrate 320. Further, in the mounted state, the second recess portion 523b is filled with a wax material 534 for fixing the ceramic substrate 520 to the mounting substrate 320. Since the second recess portion 523b extends from the end on the placement face 522 side up to the end on the back face 524 side, it is possible to easily check the wetting and melting conditions of the wax material 534 when mounting the light-emitting device 500 on the mounting substrate 320.

The internal cathode terminal 542 is a thin metal layer, and is formed as a wiring pattern. The internal cathode terminal 542 is connected to an external cathode terminal 552 provided on the mounting face 523 of the ceramic substrate 520. The external cathode terminal 552 is provided on a second recess portion 523e formed in a corner portion 523d of the mounting face 523.

Specifically, the second recess portion 523e is formed in the corner portion 523d of the mounting face 523, and the second recess portion 523e extends from the end on the placement face 522 side up to the end on the back face 524 side. A wall face 523f of the second recess portion 523e is formed so as to have an arc-shaped cross section. Note that the cross sectional shape of the wall face 523f of the second recess portion 523e may be other than the arc shape.

The external cathode terminal 552 is formed on the wall face 523f of the second recess portion 523e. The external cathode terminal 552 is formed from the end on the back face 524 side of the second recess portion 523e up to the end on the placement face 522 side. The external cathode terminal 552 is connected to the electrode land pattern 322 formed on the mounting substrate 320. Further, in the mounted state, the second recess portion 523e is filled with the wax material 534 for fixing the ceramic substrate 520 to the mounting substrate 320. Since the second recess portion 523e extends from the end on the placement face side 522 up to the end on the back face 524 side, it is possible to easily check the wetting and melting conditions of the wax material 534 when mounting the light-emitting device 500 on the mounting substrate 320.

With the light-emitting device 500 according to Embodiment 5, the ceramic substrate 520 is provided with the placement heat conduction member 561, a first heat conduction member 562, a second heat conduction member 563, a third heat conduction member 564, and a fourth heat conduction member 565. The heat conduction members 561 to 565 are formed using a metal with higher heat conductivity than that of the ceramic substrate 120.

The placement heat conduction member 561 is a thin metal layer, and is formed similarly to a wiring pattern, for example. The placement heat conduction member 561 is a member that constitutes an attachment face to which the LED chip 510 is attached. Specifically, the placement heat conduction member 561 is disposed on the placement face 522, and the LED chip 510 is die-bonded to the placement heat conduction member 561.

The first heat conduction member 562 is constituted as a metal film that is made of, for example, Au plating or the like. The first heat conduction member 562 is provided on a first recess portion 523g formed along the mounting face 523.

Specifically, the first recess portion 523g is formed from the end on the back face 524 side to the end on the placement face 522 side.

A wall face 523h of the first recess portion 523g is formed so as to have an arc-shaped cross section. The first heat conduction member 562 is formed on the wall face 523h of the first recess portion 523g. The first heat conduction member 562 is connected to the heat dissipation land pattern 323 formed on the mounting substrate 320. The first recess portion 523g is filled with the wax material 534 for fixing the ceramic substrate 520 to the mounting substrate 320. Note that the cross sectional shape of the wall face 523h of the first recess portion 523g may be other than the arc shape.

The second heat conduction member 563 is a thin metal layer, and is formed similarly to a wiring pattern, for example. The second heat conduction member 563 is a member that connects the placement heat conduction member 561 and the first heat conduction member 562. The second heat conduction member 563 can be formed integrally with the placement heat conduction member 561. In other words, the placement heat conduction member 561 may be configured to extend toward the first heat conduction member 562.

The third heat conduction member 564 is formed using a metal with high heat conductivity such as Cu, for example. The third heat conduction member 564 is a member that connects the placement heat conduction member 561 and the fourth heat conduction member 565. The third heat conduction member 564 is formed so as to pass through the inside of the ceramic substrate 520. The third heat conduction member 564 can also be formed integrally with the placement heat conduction member 561. In other words, the placement heat conduction member 561 may be configured to extend toward the fourth heat conduction member 565.

The fourth heat conduction member 565 is constituted as a metal film that is made of, for example, Au plating or the like. The fourth heat conduction member 565 is provided on the back face 524. The fourth heat conduction member 565 is formed so as to extend from the substantially center portion of the back face 524 toward the mounting face 523, and is connected to the first heat conduction member 562 on the periphery of the first recess portion 523g.

In Embodiment 5 as well, heat generated by the LED chip 510 can be efficiently released toward the mounting substrate 320 via the same first to fourth heat dissipation paths as those in Embodiments 1 and 3, and thus heat dissipation properties of the light-emitting device 500 can be improved. Accordingly, it is also possible to easily handle an increase in the size of a liquid crystal backlight device and the like.

Further, Embodiment 5 differs from Embodiment 1 in that a configuration is adopted in which the chip recess portion on which a reflecting layer is formed is not provided, and thus the light-emitting device 500 can be slimmed down by the depth of the chip recess portion (distance from the opening face to the bottom face). In this case, although light emitted from the light-emitting device 500 is diffused, it is sufficient to externally dispose a reflecting sheet or the like, as a countermeasure against diffusion of light. For example, if the light-emitting device 100 is replaced with the light-emitting device 500 in Embodiment 4, light emitted from the light-emitting device 500 is reflected by the reflecting sheet 350 and the mounting substrate 320 whose surface has been subjected to reflection processing. Thereby, light can be introduced into the light guide plate 330 similar to the case of the light-emitting device 100. Further, with the light-emitting device 500, the number of necessary green sheets can be reduced compared to that of the light-emitting device 100.

Note that a method for manufacturing the light-emitting device 500 according to Embodiment 4 is briefly described. First, green sheets in which through holes have been formed are laminated, and wiring patterns are applied. Next, the laminated green sheets are fired, so as to form a ceramic substrate in the aggregate state, which serves as the base material of the ceramic substrate 520.

After that, the through holes formed in the ceramic substrate are closed off using resin. After that, the LED chip 510 is die-bonded to the placement heat conduction member 561, and the P side electrode 511 and the N side electrode 512 of the LED chip 510 are respectively wire-bonded to the internal anode terminal 541 and the internal cathode terminal 542 with the wires 543.

After that, the fluorescent material-containing resin 533 is applied from the through hole corresponding to the first recess portion 523g with a prescribed spacing such that the wax material 534 with which the first recess portion 523g is filled, and the fluorescent material-containing resin 533 that covers the placement face 522 are prevented from being in contact with each other. At this time, the fluorescent material-containing resin 533 may be individually applied to each of the light-emitting devices 500, or the fluorescent material-containing resin 533 may be applied being spread over the plurality of light-emitting devices 500. Finally, the resultant substrate is divided into the individual light-emitting devices 500 using a method such as dicing.

As described above, the light-emitting device 500 according to Embodiment 5 is provided with the light-emitting element 510, and the package substrate 520 on which the light-emitting element 510 is placed. The package substrate 520 is provided with the placement face 522 on which the light-emitting element 510 is placed, the back face 524 that is opposed to the placement face 522, and the mounting face 523 that is opposed, between the placement face 522 and the back face 524, to the mounting substrate 320 when the light-emitting device 500 is mounted, and is provided with the first recess portion 523g that extends, on the mounting face 523, from the back face 524 toward the placement face 522 and that has the first heat conduction member 562 formed on the surface thereof, an intermediate heat conduction member (the second heat conduction member 563, the third heat conduction member 564, or the fourth heat conduction member 565) for conducting heat between the light-emitting element 510 and the first heat conduction member 562.

Accordingly, as a heat dissipation path for releasing heat generated by the light-emitting element 510 toward the mounting substrate 320, a heat dissipation path including the first heat conduction member 562 that is opposed to the mounting substrate 320, and the intermediate heat conduction member for conducting heat between the light-emitting element 510 and the first heat conduction member 562 is formed. Thereby, heat generated by the light-emitting element 510 can be efficiently released toward the mounting substrate 320, and thus heat dissipation properties of the light-emitting device 500 can be improved. Further, since the space that can be filled with the fixing wax material 534 with which the package substrate 520 is fixed to the mounting substrate 320 can be secured, the parallelism of the mounting face 523 relative to the mounting substrate 320 can be secured. Further, when the light-emitting device 500 (the mounting face 523) is mounted on the mounting substrate 320, light can be emitted in the side face direction.

Further, in the light-emitting device 500, the intermediate heat conduction member includes the second heat conduction member 563 that is connected to the first heat conduction member 562 and extends toward the light-emitting element 510 inside the package substrate 520. Accordingly, as a heat dissipation path for releasing heat generated by the light-emitting element 510 toward the mounting substrate 320, a heat dissipation path including the second heat conduction member 563 that is connected to the first heat conduction member 562 and extends toward the light-emitting element 510 inside the package substrate 520, and the first heat conduction member 562 that is connected to the second heat conduction member 563 is formed. Thereby, heat generated by the light-emitting element 510 can be efficiently released toward the mounting substrate 320, and thus heat dissipation properties of the light-emitting device 500 can be improved.

Further, in the light-emitting device 500, the intermediate heat conduction member includes the third heat conduction member 564 that is disposed from the placement face 522 up to the back face 524 inside the package substrate 520, and the fourth heat conduction member 565 that connects the third heat conduction member 564 and the first heat conduction member 562 on the back face 524. Accordingly, as a heat dissipation path for releasing heat generated by the light-emitting element 510 toward the mounting substrate 320, a heat dissipation path including the third heat conduction member 564 that is disposed from the placement face 522 up to the back face 524 inside the package substrate 520, the fourth heat conduction member 565 that is disposed so as to connect the third heat conduction member 564 and the first heat conduction member 562 on the back face 524, and the first heat conduction member 562 that is connected to the fourth heat conduction member 565 is formed. Thereby, heat generated by the light-emitting element 510 can be efficiently released toward the mounting substrate 320, and thus heat dissipation properties of the light-emitting device 500 can be improved.

Embodiment 6.

Embodiment 6

The light-emitting device 600 according to Embodiment 6 is described with reference to FIG. 18. Note that with regard to the items in common with Embodiments 1 and 3, similar reference numerals are employed where appropriate (see FIGS. 1 to 3, and 13). Note that the items given reference numerals in the hundreds in Embodiments 1 and 3 are given reference numerals in the six hundreds in Embodiment 6.

Figure 18:
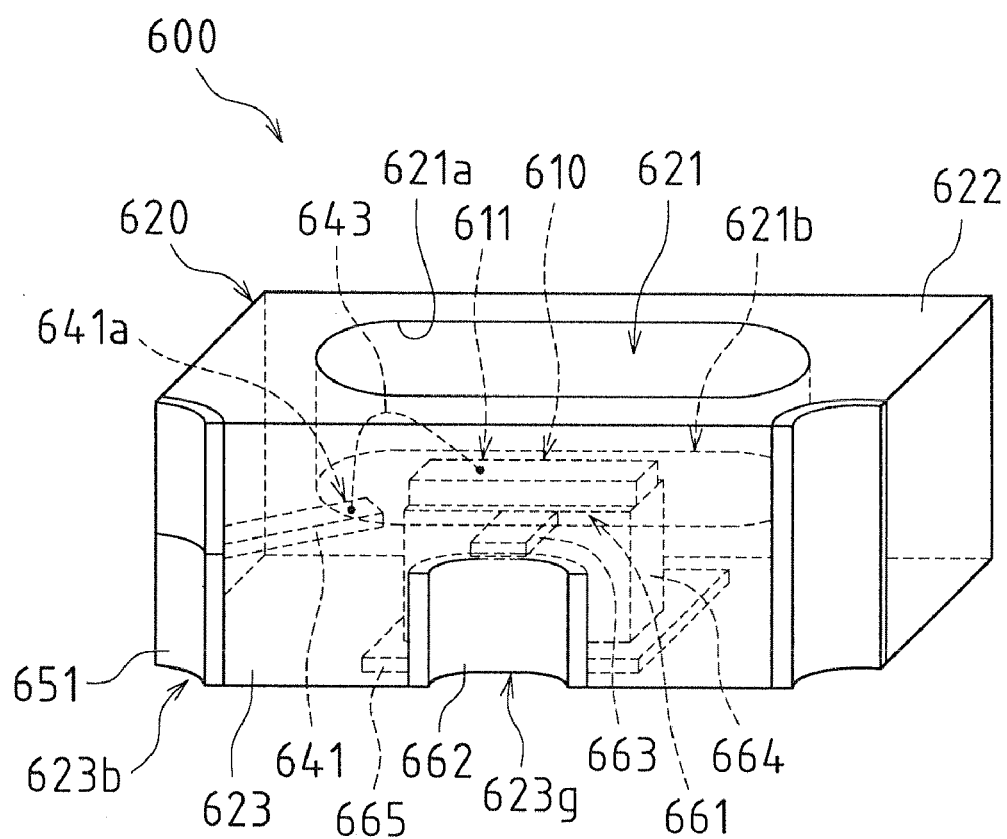
FIG. 18 is a perspective view conceptually showing a light-emitting device according to Embodiment 6 that is seen obliquely from below.

FIG. 18 is a perspective view conceptually showing the light-emitting device 600 according to Embodiment 6 that is seen obliquely from below.

The light-emitting device 600 according to Embodiment 6 differs compared to the light-emitting device 100A according to Embodiment 3 and the like in that heat conduction members 661 to 665 are also used as wiring for an LED chip (terminal). The heat conduction members 661 to 665 constitute the wiring (terminal) on the cathode side in the light-emitting device 600. In other words, a heat dissipation path for releasing heat generated by an LED chip 610 to the mounting substrate 320 also functions as the wiring (terminal) on the cathode side. Note that the wiring (terminal) on the anode side has the same configuration as that of the light-emitting device 100A according to Embodiment 3.

In the light-emitting device 600, a top-and-bottom electrode type LED chip is used as the LED chip 610. In other words, a P side electrode 611 is formed on the surface of the LED chip 610, and an N side electrode is formed on the back face of the LED chip 610.

Further, in the light-emitting device 600, an internal terminal plane constituted by an internal anode terminal 641 is provided closer to the back face 624 than the surface of the placement heat conduction member 661 serving as the placement face on which the LED chip 610 is placed is.

To be specific, a recess portion 635 is provided in a placement face 621b disposed on the bottom portion of a chip recess portion 621 of a ceramic substrate 620. An inner end portion 641a of the internal anode terminal 641 is disposed on the bottom face of the recess portion 635. An end of a wire 643 connected to the P side electrode 611 formed on the surface of the LED chip 610 is disposed in the recess portion 635.

In the light-emitting device 600 according to Embodiment 6, the ceramic substrate 620 is provided with the placement heat conduction member 661, the first heat conduction member 662, the second heat conduction member 663, the third heat conduction member 664, and the fourth heat conduction member 665. These heat conduction members 661 to 665 are formed with a conductive metal with higher heat conductivity than that of the ceramic substrate 620.

The placement heat conduction member 661 is a thin metal layer, and is formed as a cathode side wiring pattern. The placement heat conduction member 661 is a member that constitutes the placement face on which the LED chip 610 is placed. Specifically, the placement heat conduction member 661 is disposed on the placement face 621b of the chip recess portion 621, and the LED chip 610 is placed on the placement heat conduction member 661. The LED chip 610 is die-bonded on the N side electrode face formed on the back face thereof.

The first heat conduction member 662 is constituted as a metal film that is made of, for example, Au plating or the like. The first heat conduction member 662 is provided on a first recess portion 623g formed along a mounting face 623. Specifically, the first recess portion 623g extends from the end on the back face 624 side toward an opening face 622, but does not reach the end on the opening face 622 side. In other words, the first recess portion 623g extends up to a position where the second heat conduction member 663 is connected to the first heat conduction member 662. Accordingly, a part of the mounting face 623 from the end of the first recess portion 623g to the end on the opening face 622 side can be made flat, and thus the accuracy of mounting on the mounting substrate 320 can be secured.

A wall face 623h of the first recess portion 623g is formed so as to have an arc-shaped cross section. The first heat conduction member 662 is formed on the wall face 623h of the first recess portion 623g. The first heat conduction member 662 is connected to the electrode land pattern 323 formed on the mounting substrate 320. The first recess portion 623g is filled with a wax material 634 for fixing the ceramic substrate 620 to the mounting substrate 320. Note that the cross sectional shape of the wall face 623h of the first recess portion 623g may be other than the arc shape.

The second heat conduction member 663 is a thin metal layer, and is formed as a wiring pattern. The second heat conduction member 663 is a member that connects the placement heat conduction member 661 and the first heat conduction member 662. The second heat conduction member 663 is formed so as to pass through the inside of the ceramic substrate 620. In Embodiment 6, the second heat conduction member 663 is formed integrally with the placement heat conduction member 661. In other words, the placement heat conduction member 661 is configured to extend toward the first heat conduction member 662. Thus, the second heat conduction member 663 is formed integrally with the placement heat conduction member 661, and thus the ceramic substrate 620 is easily formed.

The third heat conduction member 664 is formed using a metal with high heat conductivity such as Cu, for example.

The third heat conduction member 664 is a member that connects the placement heat conduction member 661 and the fourth heat conduction member 665. The third heat conduction member 664 is formed so as to pass through the inside of the ceramic substrate 620. Note that the third heat conduction member 664 may be formed integrally with the placement heat conduction member 661. In other words, the placement heat conduction member 661 may be configured to extend toward the fourth heat conduction member 665.

The fourth heat conduction member 665 is constituted as a metal film that is made of, for example, Au plating and the like. The fourth heat conduction member 665 is provided on the back face 624. The fourth heat conduction member 665 is formed so as to extend from the substantially center portion of the back face 624 toward the mounting face 623, and is connected to the first heat conduction member 662 on the periphery of the first recess portion 623g.

In Embodiment 6 as well, heat generated by the LED chip 610 can be efficiently released toward the mounting substrate 320 via the first to fourth heat dissipation paths that are the same as those in Embodiments 1 and 3, and thus heat dissipation properties of the light-emitting device 600 can be improved. Accordingly, it is also possible to easily deal with an increase in the size of a liquid crystal backlight device and the like. In addition, in Embodiment 6, the heat conduction members 661 to 665 function as both the wiring (terminal) on the cathode side and heat dissipation paths, and thus the number of components can be reduced and a manufacturing process can be simplified.

Note that a configuration may be adopted in which the heat conduction members 661 to 665 function as both the wiring (terminal) on the anode side and heat dissipation paths. In this case, it is sufficient to use, as the LED chip 610, a top-and-bottom electrode type LED chip having an N side electrode formed on the surface thereof, and a P side electrode formed on the back face thereof. Then, the P side electrode face may be die-bonded to the placement heat conduction member 661, and the N side electrode may be wire-bonded to an internal cathode terminal.

Further, a configuration may be adopted in which a part of the heat conduction members 661 to 665 is used as the wiring (terminal) on the cathode or anode side. For example, the placement heat conduction member 661, the first heat conduction member 662, and the second heat conduction member 663 can be used as wiring (terminal) on the cathode or anode side. In this case, it is possible to form the third heat conduction member 664 using a metal such as Cu.

As described above, the light-emitting device 600 according to Embodiment 6 is provided with the light-emitting element 610, and the package substrate 620 on which the light-emitting element 610 is placed. The package substrate 620 is provided with the placement face 621b on which the light-emitting element 610 is placed, the back face 624 that is opposed to the placement face 621b, and the mounting face 623 that is opposed, between the placement face 621b and the back face 624, to the mounting substrate 320 when the light-emitting device 600 is mounted, and is provided with the first recess portion 623g that extends, on the mounting face 623, from the back face 624 toward the placement face 621b and that has the first heat conduction member 662 formed on the surface thereof, and an intermediate heat conduction member (the second heat conduction member 663, the third heat conduction member 664, or the fourth heat conduction member 665) for conducting heat between the light-emitting element 610 and the first heat conduction member 662.

Accordingly, as a heat dissipation path for releasing heat generated by the light-emitting element 610 toward the mounting substrate 320, a heat dissipation path including the first heat conduction member 662 that is opposed to the mounting substrate 320, and the intermediate heat conduction member for conducting heat between the light-emitting element 610 and the first heat conduction member 662 is formed. Thereby, heat generated by the light-emitting element 610 can be efficiently released toward the mounting substrate 320, and heat dissipation properties of the light-emitting device 600 can be improved. Further, since the space that can be filled with the fixing wax material 634 with which the package substrate 620 is fixed to the mounting substrate 320 can be secured, the parallelism of the mounting face 623 relative to the mounting substrate 320 can be secured. Further, when the light-emitting device 600 (the mounting face 623) is mounted on the mounting substrate 320, light can be emitted in the side face direction.

Further, in the light-emitting device 600, the intermediate heat conduction member includes the second heat conduction member 663 that is connected to the first heat conduction member 662 and extends toward the light-emitting element 610 inside the package substrate 620. Accordingly, as a heat dissipation path for releasing heat generated by the light-emitting element 610 toward the mounting substrate 320, a heat dissipation path including the second heat conduction member 663 that is connected to the first heat conduction member 662 and extends toward the light-emitting element 610 inside the package substrate 620, and the first heat conduction member 662 that is connected to the second heat conduction member 663 is formed. Thereby, heat generated by the light-emitting element 610 can be efficiently released toward the mounting substrate 320, and thus heat dissipation properties of the light-emitting device 600 can be improved.

Further, in the light-emitting device 600, the intermediate heat conduction member includes the third heat conduction member 664 that is disposed from the placement face 621b up to the back face 624 inside the package substrate 620, and the fourth heat conduction member 665 that connects the third heat conduction member 664 and the first heat conduction member 662 on the back face 624. Accordingly, as a heat dissipation path for releasing heat generated by the light-emitting element 610 toward the mounting substrate 320, a heat dissipation path including the third heat conduction member 664 that is disposed from the placement face 621b up to the back face 624 inside the package substrate 620, the fourth heat conduction member 665 that is disposed so as to connect the third heat conduction member 664 and the first heat conduction member 662 on the back face 624, and the first heat conduction member 662 that is connected to the fourth heat conduction member 665 is formed. Thereby, heat generated by the light-emitting element 610 can be efficiently released toward the mounting substrate 320, and thus heat dissipation properties of the light-emitting device 600 can be improved.

The present embodiments may be embodied in various other forms without departing from the gist or essential characteristics thereof. Therefore, the embodiments disclosed herein are to be considered in all respects as illustrative and not limiting. The scope of the embodiments are indicated by the appended claims rather than by the foregoing description. All variations and modifications that come within the meaning and range of equivalency of the claims are intended to be embraced therein.

What is claimed is:

1. A light-emitting device comprising a light-emitting element, and a package substrate on which the light-emitting element is placed,
the package substrate including:

a placement face on which the light-emitting element is placed, a back face that is opposed to the placement face, and a mounting face that is opposed to a mounting substrate, between the placement face and the back face, when the light-emitting device is mounted, a first recess portion formed along the mounting face so as to extend from the back face toward the placement face, a first heat conduction member formed on a surface of the first recess portion, and an intermediate heat conduction member for conducting heat between the light-emitting element and the first heat conduction member.

2. The light-emitting device according to claim 1, wherein the intermediate heat conduction member includes a second heat conduction member that is connected to the first heat conduction member and extends toward the light-emitting element inside the package substrate.

3. The light-emitting device according to claim 2, comprising a placement heat conduction member on which the light-emitting element is placed, wherein the placement heat conduction member is connected to the second heat conduction member.

4. The light-emitting device according to claim 3, wherein the placement heat conduction member and the second heat conduction member are formed integrally.

5. The light-emitting device according to claim 1, wherein the intermediate heat conduction member includes a third heat conduction member that is disposed from the placement face up to the back face inside the package substrate, and a fourth heat conduction member that connects the third heat conduction member and the first heat conduction member on the back face.

6. The light-emitting device according to claim 5, comprising a placement heat conduction member on which the light-emitting element is placed, wherein the placement heat conduction member is connected to the third heat conduction member.

7. The light-emitting device according to claim 6, wherein the placement heat conduction member and the third heat conduction member are formed integrally.

8. The light-emitting device according to claim 1, wherein the package substrate is a ceramic substrate.

9. The light-emitting device according to claim 1, wherein the first recess portion is formed from the back face side of the mounting face to a position corresponding to the placement face.

10. The light-emitting device according to claim 1, wherein a wall face of the first recess portion is formed so as to have an arc-shaped cross section.

11. The light-emitting device according to claim 1, comprising an internal anode terminal and an internal cathode terminal that are connected to the light-emitting element, wherein the internal anode terminal is connected to an external anode terminal that is provided on the mounting face, and the internal cathode terminal is connected to an external cathode terminal that is provided on the mounting face.

12. The light-emitting device according to claim 11, wherein the internal anode terminal and the internal cathode terminal each extend in a direction parallel to the placement face on which the light-emitting element is placed.

13. The light-emitting device according to claim 11, wherein the external anode terminal and the external cathode terminal are each provided from an end on the back face side of the mounting face to a position corresponding to the placement face.

14. The light-emitting device according to claim 13, wherein the external anode terminal and the external cathode terminal are respectively provided on second recess portions that are formed in corner portions of the package substrate.

15. The light-emitting device according to claim 14, wherein a wall face of each of the second recess portions is formed so as to have an arc-shaped cross section.

16. The light-emitting device according to claim 12, wherein a difference in level is provided between the placement face on which the light-emitting element is placed and an internal terminal plane that is constituted by the internal anode terminal and the internal cathode terminal.

17. The light-emitting device according to claim 16, wherein the internal terminal plane is disposed closer to the back face than the placement face on which the light-emitting element is placed is.

18. A planar light source, comprising:
the light-emitting device according to claim 1;
a mounting substrate on which the light-emitting device is mounted; and
a light guide plate for guiding light from the light-emitting device,
wherein the first recess portion is filled with a wax material for fixing the package substrate to the mounting substrate.

19. A planar light source, comprising:
the light-emitting device according to claim 14;
a mounting substrate on which the light-emitting device is mounted; and
a light guide plate for guiding light from the light-emitting device,
wherein each of the second recess portions is filled with a wax material for fixing the package substrate to the mounting substrate.

20. A liquid crystal display device, comprising:
the planar light source according to claim 18; and
a liquid crystal panel,
wherein the planar light source is used as a backlight of the liquid crystal panel.

* * * * *